US008575592B2

(12) United States Patent
Bergmann et al.

(10) Patent No.: US 8,575,592 B2
(45) Date of Patent: Nov. 5, 2013

(54) GROUP III NITRIDE BASED LIGHT EMITTING DIODE STRUCTURES WITH MULTIPLE QUANTUM WELL STRUCTURES HAVING VARYING WELL THICKNESSES

(75) Inventors: Michael John Bergmann, Chapel Hill, NC (US); Daniel Carleton Driscoll, Raleigh, NC (US); Ashonita Chavan, Raleigh, NC (US); Pablo Cantu-Alejandro, Raleigh, NC (US); James Ibbotson, Santa Barbara, CA (US)

(73) Assignee: Cree, Inc., Durham, NC (US)

( * ) Notice: Subject to any disclaimer, the term of this patent is extended or adjusted under 35 U.S.C. 154(b) by 562 days.

(21) Appl. No.: 12/699,541

(22) Filed: Feb. 3, 2010

(65) Prior Publication Data
US 2011/0187294 A1    Aug. 4, 2011

(51) Int. Cl.
*H01L 33/00* (2010.01)
(52) U.S. Cl.
USPC .............................................. 257/13
(58) Field of Classification Search
USPC ............. 257/13, 79–103, 918, 46, 194, 257/E29.246–E29.253, E29.069–E29.071, 257/E29.245, E49.001–E49.004, E21.404, 257/E51.018–E51.022, E33.001–E33.077, 257/116, 117, 432–437, 749, 257/E33.056–E33.059, E25.032, 186, 257/E31.005, E25.028, 457, 459, 110, 259, 257/458, 461–464, 470, 490, 494–495, 509, 257/525, 544–550, 656, 927, 929; 438/22–47, 69, 493, 503, 507, 956, 438/208, 912; 315/363
See application file for complete search history.

(56) References Cited

U.S. PATENT DOCUMENTS

| 5,294,833 A | 3/1994 | Schetzina |
| 5,351,255 A | 9/1994 | Schetzina |
| 5,366,927 A | 11/1994 | Schetzina |

(Continued)

FOREIGN PATENT DOCUMENTS

| EP | 0 881 666 A2 | 12/1998 |
| EP | 1 063 711 A1 | 12/2000 |

(Continued)

OTHER PUBLICATIONS

American Heritage Dictionary, Second College Edition, 1982, Houghton Mifflin Company, Boston, MA., p. 867, definition of the English language word "On."

(Continued)

*Primary Examiner* — Dao H Nguyen
*Assistant Examiner* — Tram H Nguyen
(74) *Attorney, Agent, or Firm* — Myers Bigel Sibley & Sajovec, P.A.

(57) ABSTRACT

A Group III nitride based light emitting diode includes a p-type Group III nitride based semiconductor layer, an n-type Group III nitride based semiconductor layer that forms a P-N junction with the p-type Group III nitride based semiconductor layer, and a Group III nitride based active region on the n-type Group III nitride based semiconductor layer. The active region includes a plurality of sequentially stacked Group III nitride based wells including respective well layers. The plurality of well layers includes a first well layer having a first thickness and a second well layer having a second thickness. The second well layer is between the P-N junction and the first well layer, and the second thickness is greater than the first thickness.

33 Claims, 14 Drawing Sheets

(56) References Cited

U.S. PATENT DOCUMENTS

| | | | |
|---|---|---|---|
| 5,393,993 A | 2/1995 | Edmond et al. | |
| 5,409,859 A | 4/1995 | Glass et al. | |
| 5,523,589 A | 6/1996 | Edmond et al. | |
| 5,585,648 A | 12/1996 | Tischler | |
| 5,661,074 A | 8/1997 | Tischler | |
| 5,670,798 A | 9/1997 | Schetzina | |
| 5,679,152 A | 10/1997 | Tischler et al. | |
| 5,679,965 A | 10/1997 | Schetzina | |
| 5,684,309 A | 11/1997 | McIntosh et al. | |
| 5,744,829 A | 4/1998 | Murasato et al. | |
| 5,771,256 A | 6/1998 | Bhat | |
| 5,777,350 A | 7/1998 | Nakamura et al. | |
| 5,818,072 A | 10/1998 | Schetzina | |
| 5,874,747 A | 2/1999 | Redwing et al. | |
| 6,046,464 A | 4/2000 | Schetzina | |
| 6,060,335 A | 5/2000 | Rennie et al. | |
| 6,133,589 A | 10/2000 | Krames et al. | |
| 6,150,672 A | 11/2000 | Kaneko | |
| 6,153,010 A | 11/2000 | Kiyoku et al. | |
| 6,153,894 A | 11/2000 | Udagawa | |
| 6,156,581 A | 12/2000 | Vaudo et al. | |
| 6,162,656 A | 12/2000 | Kunisato et al. | |
| 6,172,382 B1 | 1/2001 | Nagahama et al. | |
| 6,201,262 B1 | 3/2001 | Edmond et al. | |
| 6,238,945 B1 | 5/2001 | Kaneko | |
| 6,337,493 B1 | 1/2002 | Tanizawa et al. | |
| 6,410,939 B1 | 6/2002 | Koide et al. | |
| 6,447,604 B1 | 9/2002 | Flynn et al. | |
| 6,452,214 B2 | 9/2002 | Kaneyama et al. | |
| 6,459,100 B1 | 10/2002 | Doverspike et al. | |
| 6,504,171 B1 * | 1/2003 | Grillot et al. | 257/14 |
| 6,576,933 B2 | 6/2003 | Sugawara et al. | |
| 6,586,762 B2 | 7/2003 | Kozaki | |
| 6,608,330 B1 | 8/2003 | Yamada | |
| 6,664,560 B2 | 12/2003 | Emerson et al. | |
| 6,717,185 B2 | 4/2004 | Edmond et al. | |
| 6,734,033 B2 | 5/2004 | Emerson et al. | |
| 6,734,035 B2 | 5/2004 | Watanabe et al. | |
| 6,791,119 B2 | 9/2004 | Slater et al. | |
| 6,794,684 B2 | 9/2004 | Slater et al. | |
| 6,821,800 B2 | 11/2004 | Koide et al. | |
| 6,833,564 B2 | 12/2004 | Shen et al. | |
| 6,891,268 B2 | 5/2005 | Tomiya et al. | |
| 6,943,381 B2 | 9/2005 | Gardner et al. | |
| 6,958,497 B2 | 10/2005 | Emerson et al. | |
| 6,995,389 B2 | 2/2006 | Kim et al. | |
| 7,034,328 B2 | 4/2006 | Doverspike et al. | |
| 7,279,717 B2 | 10/2007 | Yameda | |
| 7,557,380 B2 | 7/2009 | Haberern et al. | |
| 2002/0053676 A1 | 5/2002 | Kozaki | |
| 2002/0056836 A1 | 5/2002 | Sawazaki et al. | |
| 2002/0195606 A1 | 12/2002 | Edmond et al. | |
| 2003/0006418 A1 | 1/2003 | Emerson et al. | |
| 2003/0020061 A1 | 1/2003 | Emerson et al. | |
| 2003/0085409 A1 | 5/2003 | Shen et al. | |
| 2003/0153112 A1 | 8/2003 | Watanabe et al. | |
| 2004/0012011 A1 | 1/2004 | Tomiya et al. | |
| 2004/0056258 A1 | 3/2004 | Tadatomo et al. | |
| 2005/0056824 A1 | 3/2005 | Bergmann et al. | |
| 2005/0127391 A1 * | 6/2005 | Yanamoto | 257/103 |
| 2006/0002442 A1 | 1/2006 | Haberern et al. | |
| 2006/0046328 A1 | 3/2006 | Raffetto et al. | |
| 2006/0081871 A1 | 4/2006 | Streubel | |
| 2006/0186418 A1 | 8/2006 | Edmond et al. | |
| 2007/0018198 A1 | 1/2007 | Brandes et al. | |
| 2007/0051962 A1 | 3/2007 | Lai | |
| 2008/0258130 A1 | 10/2008 | Bergmann et al. | |
| 2009/0206322 A1 * | 8/2009 | Brandes | 257/13 |
| 2009/0250686 A1 | 10/2009 | Sato et al. | |
| 2009/0283746 A1 | 11/2009 | Chua et al. | |

FOREIGN PATENT DOCUMENTS

| | | |
|---|---|---|
| EP | 1 189 289 A1 | 3/2002 |
| EP | 1 221 723 A1 | 7/2002 |
| EP | 1 313 187 A1 | 5/2003 |
| JP | 6268257 A | 9/1994 |
| JP | 07-162038 A | 6/1995 |
| JP | 176826 A | 7/1995 |
| JP | 08-023124 A | 1/1996 |
| JP | 08-070139 A | 3/1996 |
| JP | 08-162671 A | 6/1996 |
| JP | 08-274414 A | 10/1996 |
| JP | 08-330630 A | 12/1996 |
| JP | 09-148678 A | 6/1997 |
| JP | 09-153642 A | 6/1997 |
| JP | 9162444 A | 6/1997 |
| JP | 9219556 A | 8/1997 |
| JP | 9266326 A | 10/1997 |
| JP | 10012969 A | 1/1998 |
| JP | 10-041581 A | 2/1998 |
| JP | 10-065271 A2 | 3/1998 |
| JP | 10145000 A | 5/1998 |
| JP | 10145002 A | 5/1998 |
| JP | 10-335757 A | 12/1998 |
| JP | 11040850 A | 2/1999 |
| JP | 11074562 | 3/1999 |
| JP | 11-177175 | 7/1999 |
| JP | 11186659 | 7/1999 |
| JP | 11191638 | 7/1999 |
| JP | 11224972 | 8/1999 |
| JP | 11238945 | 8/1999 |
| JP | 11251684 | 9/1999 |
| JP | 11298090 | 10/1999 |
| JP | 11-330552 | 11/1999 |
| JP | 2000-068594 A | 3/2000 |
| JP | 2000133883 | 5/2000 |
| JP | 2000150956 | 5/2000 |
| JP | 2000-216432 | 8/2000 |
| JP | 2000244072 | 9/2000 |
| JP | 2000307149 | 11/2000 |
| JP | 2001-168471 | 6/2001 |
| WO | WO 98/31055 A1 | 7/1998 |
| WO | WO 99/05728 A1 | 2/1999 |
| WO | WO 99/46822 | 9/1999 |
| WO | WO 00/21143 | 4/2000 |
| WO | WO 00/76004 A1 | 12/2000 |
| WO | WO 02/05399 A1 | 1/2002 |

OTHER PUBLICATIONS

Communication and European Search Report corresponding to European Application No. 10180319.5 dated Dec. 7, 2010; 6 pages.

European Search Report corresponding to EP 03 07 8515; mailed on Feb. 2, 2004.

Flynn, J.S., et al., Properties of Delta Doped $Al_{0.25}Ga_{0.75}N$ and GaN Epitaxial Layers, Abstract, Paper #L11.44, Materials Research Society 2002 Fall Symposium, Warrendale, PA, USA.

International Search Report for PCT/US 02/16407; Date of Mailing Nov. 13, 2002.

International Search Report, mailed Feb. 15, 2006, for corresponding application No. PCT/US2005/022597.

Japanese Office Action and English Translation (5 pages), Corresponding to Japanese Application No. 2007-523569; May 24, 2011.

Keyan, K., et al., "The Effect of Periodic Silane Burst on the Properties of GaN on Si (111) Substrates," *Singapore-MIT Alliance (SMA)*, Advanced Materials for Micro- and Nano-Systems (AMMNS), File No. AMMNS004.pdf, available in DSpace@MIT on Dec. 9, 2004, issued Jan. 2005.

Kim, K.H., et al., "III-nitride Ultraviolet Light-emitting Diodes with Delta Doping," *Appl. Phys. Lett.*, Jul. 21, 2003, pp. 566-568, vol. 83, No. 3.

KIPO's Preliminary Rejection in corresponding Korean Patent Application No. 10-2009-7022150 (3 pages w/2 page translation).

Korean Intellectual Property Office non-Final Rejection; Aug. 28, 2008.

Korean Non-Final Rejection and English Translation (12 pages), faxed Sep. 21, 2008, for corresponding Korean Application No. 10-2003-7012710.

(56) References Cited

OTHER PUBLICATIONS

Korean Non-Final Rejection and English Translation (8 pages) corresponding to Korean Patent Application No. 10-2008-7026427; Mailing Date: Jan. 23, 2009.

Pan, Y.B., et al., "Reduction of Threading Edge Dislocation Density in n-type GaN by Si Delta-Doping," *Journal of Crystal Growth*, Jan. 15, 2006, pp. 255-258, vol. 286, No. 2.

Partial European Search Report (6 pages) corresponding to European Patent Application No. 09157557.1; Dated: May 28, 2009.

Sciana, B., et al., "Epitaxial Growth and Characterisation of Silicon Delta-Doped GaAs, AlAs and $Al_xGa1-_xAs$," *Cryst. Res. Technol.*, Aug. 10, 2001, pp. 1145-1154, vol. 36.

Wang, L.S., et al., "Effects of Periodic Delta-doping on the Properties of GaN:Si Films Grown on Si (III) Substrates," *Appl. Phys. Lett.*, Dec. 13, 2004, vol. 85, No. 24.

International Search Report and Written Opinion of the International Searching Authority for International Application No. PCT/US 11/23114; Date of Mailing: May 19, 2011; 13 pages.

International Preliminary Report on Patentability Corresponding to International Application No. PCT/US2011/023114; Date of Mailing: Aug. 16, 2012; 9 Pages.

\* cited by examiner

GROUP III NITRIDE BASED LIGHT EMITTING DIODE STRUCTURES WITH MULTIPLE QUANTUM WELL STRUCTURES HAVING VARYING WELL THICKNESSES

FIELD OF THE INVENTION

This invention relates to microelectronic devices and fabrication methods therefor, and more particularly to structures which may be utilized in Group III nitride semiconductor devices, such as light emitting diodes (LEDs).

BACKGROUND

Light emitting diodes (LEDs) are widely used in consumer and commercial applications. Continued developments in LED technology has resulted in highly efficient and mechanically robust light sources that can cover the visible spectrum and beyond. These attributes, coupled with the long service life of solid state devices, have enabled a variety of new display applications, and have even resulted in the use of LEDs in general illumination applications with the potential to replace incandescent and fluorescent lamps.

As is well known to those having skill in the art, a light emitting diode generally includes an active region fabricated from a material having a suitable bandgap such that electron-hole recombination results in the generation of light when current is passed through the device. In particular, materials in the Group III-nitride material system, such as GaN, InGaN, AlGaN, InAlGaN, etc., have been proven useful for generating blue, green and ultraviolet light with relatively high efficiency.

Group III-nitride based LEDs may be fabricated on growth substrates (such as a silicon carbide substrates) to provide horizontal devices (with both electrical contacts on a same side of the LED) or vertical devices (with electrical contacts on opposite sides of the LED). Moreover, the growth substrate may be maintained on the LED after fabrication or removed (e.g., by etching, grinding, polishing, etc.). The growth substrate may be removed, for example, to reduce a thickness of the resulting LED and/or to reduce a forward voltage through a vertical LED. A horizontal device (with or without the growth substrate), for example, may be flip chip bonded (e.g., using solder) to a carrier substrate or printed circuit board, or wire bonded. A vertical device (without or without the growth substrate) may have a first terminal solder bonded to a carrier substrate or printed circuit board and a second terminal wire bonded to the carrier substrate or printed circuit board.

Attempts to improve the light output of Group III nitride based devices have included providing differing configurations of the active regions of the devices. Such attempts have, for example, included the use of single and/or double heterostructure active regions. Similarly, quantum well devices with one or more Group III nitride quantum wells have also been fabricated. While such attempts have improved the efficiency of Group III nitride based devices, further improvements may still be achieved.

In particular, one problem that has been experienced with Group III-nitride devices is that of current droop, which refers to a phenomenon in which light output increases with current density up to a point, and then begins to level off. Thus, device efficiency may drop off at higher currents. Although not bound by any particular theory, it is presently believed that current droop may be the result of one or several factors, including saturation of hole injection and/or inefficient (i.e., non-light generating) electron-hole recombination at higher device currents.

SUMMARY

A Group III nitride based light emitting diode according to some embodiments includes a p-type Group III nitride based semiconductor layer, an n-type Group III nitride based semiconductor layer, and a Group III nitride based active region on the n-type Group III nitride based semiconductor layer. The active region includes a plurality of sequentially stacked Group III nitride based wells including respective well layers. The plurality of well layers includes a first well layer having a first thickness and a second well layer having a second thickness. The second well layer is between the p-type Group III nitride based semiconductor layer and the first well layer, and the second thickness is greater than the first thickness.

In response to being energized, a light emitting diode according to some embodiments may emit light having a spectral purity characterized by a full width half maximum (FWHM) that is less than about 30 nm. In some embodiments, the light emitted by the light emitting diode may have a spectral purity characterized by a FWHM that is less than about 20 nm. In further embodiments, the light emitted by the light emitting diode may have a spectral purity characterized by a FWHM that is less than about 15 nm and in still further embodiments less than about 10 nm.

In some embodiments, the first well layer has a first bandgap, the second well layer has a second bandgap, and the first bandgap may be less than the second bandgap.

The first well layer may include $In_{X1}Ga_{1-X1}N$, the second well layer may include $In_{X2}Ga_{1-X2}N$, where X1>X2.

The plurality of well layers may have respective thicknesses that decrease with distance from the p-type Group III nitride based semiconductor layer. Further, the plurality of well layers have respective bandgaps that decrease with distance from the p-type Group III nitride based semiconductor layer. In some embodiments, the plurality of well layers include $In_XGa_{1-X}N$, where X varies in inverse proportion to the thickness of the respective well layers. The plurality of well layers have respective band gaps that vary in proportion to the thickness of the respective well layers.

The plurality of well layers include $In_XGa_{1-X}N$ where $0<X<1$, and the plurality of well layers have indium compositions that increase with distance from the p-type Group III nitride based semiconductor layer.

The plurality of well layers have thicknesses that decrease approximately linearly from well layer to well layer.

The plurality of well layers may include a first plurality of well layers having the first thickness and a second plurality of well layers having the second thickness.

The plurality of well layers may include a first plurality of well layers having the first thickness and a second plurality of well layers having thicknesses that increase from the first thickness to the second thickness.

The second plurality of well layers may have thicknesses that increase approximately linearly from the first thickness to the second thickness.

The second plurality of well layers may be between the first plurality of well layers and the p-type Group III nitride based semiconductor layer.

The plurality of well layers may include a first plurality of well layers having thicknesses that increase from the first thickness to the second thickness and a second plurality of well layers having the second thickness.

The first plurality of well layers have thicknesses that increase approximately linearly from the first thickness to the second thickness.

The second plurality of well layers may be between the first plurality of well layers and the p-type Group III nitride based semiconductor layer.

In some embodiments, the second thickness may be at least about 18% greater than the first thickness. In particular embodiments, the second thickness may be about 25% greater than the first thickness. In other embodiments, the second thickness may be about 35% greater than the first thickness. In further embodiments, the second thickness may be about 40% greater than the first thickness. In still further embodiments; the second thickness may be about 50% greater than the first thickness.

The well layers may include indium, and a composition of indium in the first well layer may be greater than a composition of indium in the second well layer. The composition of indium in the well layers may range from about 0.05 to about 0.5.

The light emitting diode may further include a plurality of barrier layers on respective ones of the well layers including a first barrier layer on the first well layer between the first well layer and the p-type Group III nitride based semiconductor layer and a second barrier layer on the second well layer between the second well layer and the p-type Group III nitride based semiconductor layer, and the first barrier layer may be thicker than the second barrier layer.

The light emitting diode may further include a plurality of barrier layers on respective ones of the plurality of well layers, the plurality of barrier layers having thicknesses that increase with distance from the p-type Group III nitride based semiconductor layer. In some embodiments, the barrier layer are about the same thickness. Furthermore, the thickness of the barrier layers may vary in a manner that is unrelated to variation in the thickness of the well layers.

The light emitting diode may further include a plurality of barrier layers on respective ones of the well layers including a first barrier layer on the first well layer between the first well layer and the p-type Group III nitride based semiconductor layer and a second barrier layer on the second well layer between the second well layer and the p-type Group III nitride based semiconductor layer, and the second barrier layer may be thicker than the first barrier layer.

The light emitting diode may further include a plurality of barrier layers on respective ones of the plurality of well layers, the plurality of barrier layers having thicknesses that decrease with distance from the p-type Group III nitride based semiconductor layer.

The active region may include a plurality of well groups. Each of the well groups may include a Group III nitride based well support layer, wherein the Group III nitride based well layer is on the well support layer, and a Group III nitride based well cap layer on the Group III nitride based well layer. A combined thickness of the well support layer and the well cap layer maybe from about 50 Å to about 400 Å. The well layers have thicknesses of from about 10 Å to about 50 Å.

A Group III nitride based light emitting diode according to further embodiments includes an n-type Group III nitride based semiconductor layer and a p-type Group III nitride based semiconductor layer forming a P-N junction with the n-type Group III nitride based semiconductor layer. A Group III nitride based active region on the n-type Group III nitride based semiconductor layer is adjacent the P-N junction. The active region includes a plurality of sequentially stacked Group III nitride based wells including respective well layers. The plurality of well layers may include a first well layer having a first thickness and a second well layer having a second thickness. The second well layer is between the P-N junction and the first well layer, and the second thickness is greater than the first thickness.

A method of forming a Group III nitride based light emitting diode includes providing an n-type Group III nitride based semiconductor layer, providing a Group III nitride based multiple well active region on the n-type Group III nitride based semiconductor layer, the active region including a plurality of sequentially stacked Group III nitride based wells including respective well layers, and providing a p-type Group III nitride based semiconductor layer on the active region. A first one of the plurality of well layers has a first thickness, and a second one of the plurality of well layers has a second thickness. The second one of the plurality of well layers is formed between the p-type Group III nitride based semiconductor layer and the first one of the plurality of well layers, and the second thickness is greater than the first thickness.

A Group III nitride based light emitting diode according to further embodiments includes a p-type Group III nitride based semiconductor layer, an n-type Group III nitride based semiconductor layer that forms a P-N junction with the p-type Group III nitride based semiconductor layer, and a Group III nitride based active region on the n-type Group III nitride based semiconductor layer. The active region includes a plurality of sequentially stacked Group III nitride based wells including respective well layers. The plurality of well layers may include a first well layer having a first thickness and a second well layer having a second thickness, wherein the second thickness is greater than the first thickness. In response to being energized, the light emitting diode may emit light having a spectral purity characterized by a full width half maximum (FWHM) that is less than about 30 nm. In some embodiments, the light emitted by the light emitting diode may have a spectral purity characterized by a FWHM that is less than about 20 nm. In further embodiments, the light emitted by the light emitting diode may have a spectral purity characterized by a FWHM that is less than about 15 nm and in still further embodiments less than about 10 nm.

A Group III nitride based light emitting diode according to some embodiments includes a first light emitting well layer having a first thickness and configured to generate light having a first dominant wavelength when energized by passing electric current therethrough, and a second light emitting well layer having a second thickness that is different from the first thickness and that is configured to generate light having a second dominant wavelength when energized by passing electric current therethrough. In some embodiments, the first dominant wavelength may be no more than about 10 nm different from the second dominant wavelength. In other embodiments, the first dominant wavelength may be no more than about 5 nm different from the second dominant wavelength. In further embodiments, the first dominant wavelength may be no more than about 2.5 nm different from the second dominant wavelength.

A method of generating light according to some embodiments includes passing electric current through an active layer of a light emitting device including first and second well layers, the first well layer is configured to have increased internal quantum efficiency at a first current density and the second well is configured to have an increased internal efficiency at a second current density that is different from the first current density.

BRIEF DESCRIPTION OF THE DRAWINGS

Other features of the present invention will be more readily understood from the following detailed description of specific embodiments thereof when read in conjunction with the accompanying drawings, in which.

DETAILED DESCRIPTION OF EMBODIMENTS

Figure 1:
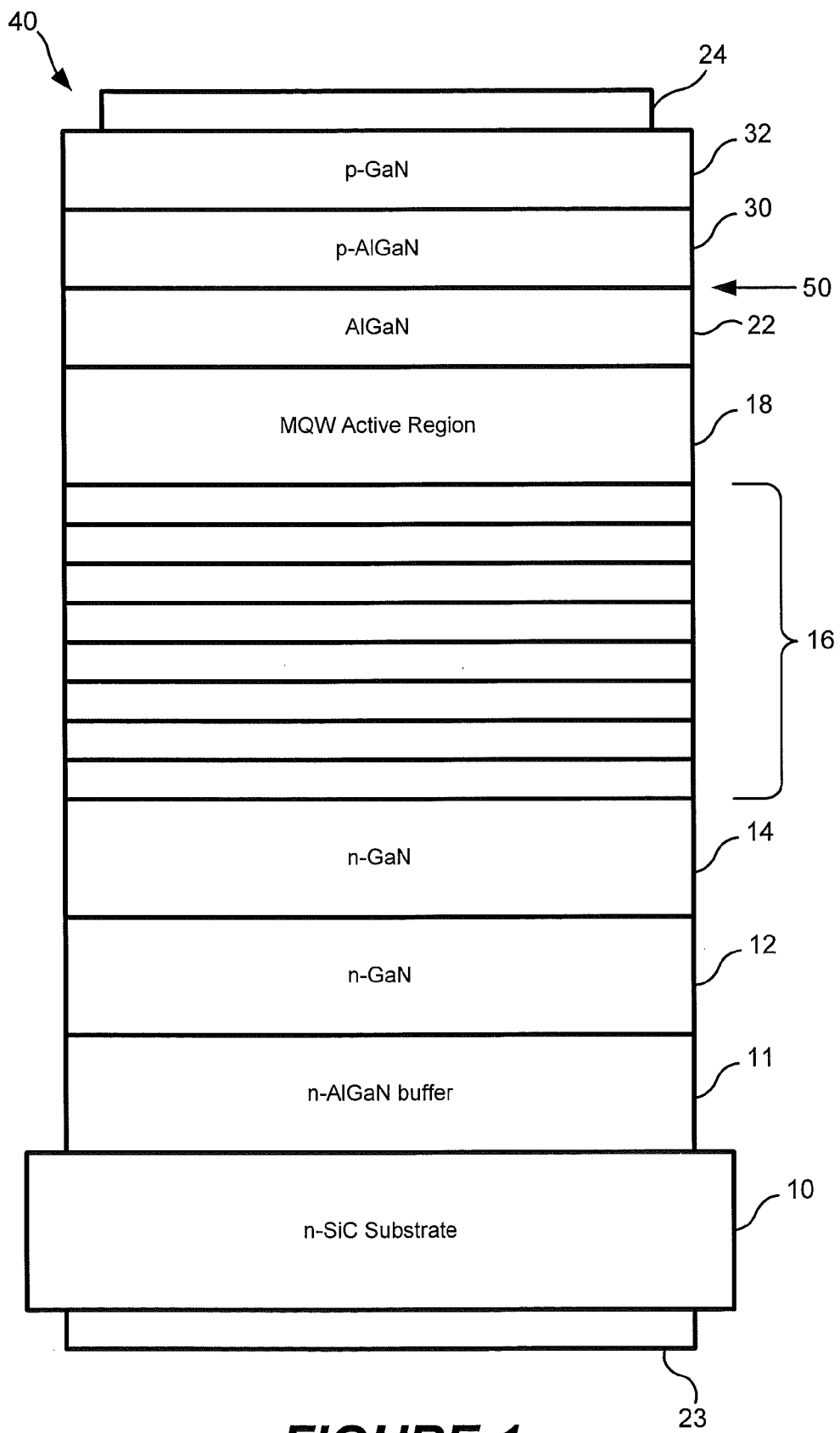
FIG. 1 is a schematic illustration of a Group III nitride light emitting diode incorporating embodiments.

The present invention now will be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the relative thickness of layers and regions may be exaggerated for clarity. Like numbers refer to like elements throughout. It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Moreover, each embodiment described and illustrated herein includes its complementary conductivity type embodiment as well.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

Embodiments of the present invention will be described with reference to FIG. 1 that illustrates a light emitting diode (LED) structure 40. The LED structure 40 of FIG. 1 includes a substrate 10, which may be 4H or 6H n-type silicon carbide. The substrate 10 may also include sapphire, bulk gallium nitride, silicon, or another suitable substrate. However, it will be appreciated that the substrate 10 is optional and may be omitted from the final device structure. Also included in the LED structure 40 of FIG. 1 is a layered semiconductor structure comprising gallium nitride-based semiconductor layers on the substrate 10. Namely, the LED structure 40 illustrated includes the following layers: a nitride buffer layer 11 which may include AlGaN, a first silicon-doped nitride layer 12 which may include GaN, a second silicon doped nitride layer 14 which may include GaN, a nitride superlattice structure 16 that may include alternating layers of silicon-doped GaN and/or InGaN, a nitride active region 18, which may be provided by a multiple well structure, such as a multiple quantum well (MQW) structure, an undoped nitride layer 22 which may include AlGaN, a nitride layer 30 which may include AlGaN doped with a p-type impurity, and a nitride contact layer 32, also doped with a p-type impurity.

The labels of layers in FIG. 1 are provided as examples only, and that a structure according to embodiments of the invention could have layers formed of different materials than the ones indicated in FIG. 1.

As used herein, the "active region" of a light emitting device refers to the region in which majority and minority electronic carriers (e.g., holes and electrons) recombine to produce light. In general, an active region according to embodiments of the invention can include a double heterostructure or a well structure, such as a quantum well structure. "Nitride layers" refers to nitride based III-V semiconductor layers, such as GaN, InN, AlN, InGaN, AlGaN and/or AlInGaN.

The contact layer 32 may be grown using ammonia as a source gas together with a carrier gas(es) such as hydrogen ($H_2$), nitrogen ($N_2$), an inert gas(es), and/or mixtures thereof. Moreover, the contact layer 32 may be subjected to a post deposition anneal at a temperature of at least about 750 degrees C. in an atmosphere including nitrogen ($N_2$), an inert gas(es), oxygen ($O_2$), and/or mixtures thereof.

The structure further includes an n-type ohmic contact 23 on the substrate 10 and a p-type ohmic contact 24 on the contact layer 32.

The buffer layer 11 may include n-type AlGaN having a graded aluminum composition. Examples of buffer layers between silicon carbide and group III-nitride materials are provided in U.S. Pat. Nos. 5,393,993, 5,523,589, and 7,034, 328, assigned to the assignee of the present invention, the disclosures of which are incorporated by reference as if fully set forth herein. Similarly, embodiments of the present invention may also include structures such as those described in U.S. Pat. No. 6,201,262 entitled "Group III Nitride Photonic Devices on Silicon Carbide Substrates With Conductive Buffer Interlayer Structure," the disclosure of which is incorporated herein by reference as if set forth fully herein.

Group III-nitride based LEDs according to some embodiments may be provided as horizontal devices (with both electrical contacts on a same side of the LED) or vertical devices (with electrical contacts on opposite sides of the LED). Moreover, the growth substrate may be maintained on the LED after fabrication or removed (e.g., by etching, grinding, polishing, etc.). The growth substrate may be removed, for example, to reduce a thickness of the resulting LED and/or to reduce a forward voltage through a vertical LED. A horizontal device (with or without the growth substrate), for example, may be flip chip bonded (e.g., using solder) to a carrier substrate or printed circuit board, or wire bonded. A vertical device (without or without the growth substrate) may have a first terminal solder bonded to a carrier substrate, header, submount or printed circuit board and a second terminal wire bonded to the carrier substrate, header, submount or printed circuit board.

The first GaN layer 12 may be between about 500 nm and 6000 nm thick (inclusive) and may in some embodiments be about 4000 nm thick. The first nitride layer 12 may be doped with silicon at a level of about $5 \times 10^{17}$ cm$^{-3}$ to $7 \times 10^{18}$ cm$^{-3}$. The second nitride layer 14 may be between about 10 Å and 500 Å thick (inclusive), and in some embodiments may be about 80 Å thick. The second nitride layer 14 may be doped with silicon at a level of less than about $5 \times 10^{19}$ cm$^{-3}$.

The superlattice structure 16 may include alternating layers of In$_X$Ga$_{1-X}$N and In$_Y$Ga$_{1-Y}$N, wherein X is between 0 and 1 inclusive and X is not equal to Y. In some embodiments, X=0, so that the superlattice structure 16 includes alternating layers of GaN and InGaN. In some embodiments, the thickness of each of the alternating layers of InGaN is about 5-40 Å thick inclusive, and the thickness of each of the alternating layers of GaN is about 5-100 Å thick inclusive. In certain embodiments, the GaN layers are about 50 Å thick and the InGaN layers are about 15 Å thick. The superlattice structure 16 may include from about 5 to about 50 periods (where one period equals one repetition each of the In$_X$Ga$_{1-X}$N and In$_Y$Ga$_{1-Y}$N layers that comprise the superlattice). In one embodiment, the superlattice structure 16 includes 25 periods. In another embodiment, the superlattice structure 16 includes 10 periods. The number of periods, however, may be decreased by, for example, increasing the thickness of the respective layers. Thus, for example, doubling the thickness of the layers may be utilized with half the number of periods. Alternatively, the number and thickness of the periods may be independent of one another.

In some embodiments, the superlattice 16 is doped with an n-type impurity such as silicon at a level of from about $1 \times 10^{17}$ cm$^{-3}$ to about $5 \times 10^{19}$ cm$^{-3}$. Such a doping level may be actual doping or average doping of the layers of the superlattice 16. If such doping level is an average doping level, then it may be beneficial to provide doped layers adjacent the superlattice structure 16 that provide the desired average doping which the doping of the adjacent layers is averaged over the adjacent layers and the superlattice structure 16. By providing the superlattice 16 between the substrate 10 and the active region 18, a better surface may be provided on which to grow the InGaN-based active region 18. While not wishing to be bound by any theory of operation, it is believed that strain effects in the superlattice structure 16 provide a growth surface that is conducive to the growth of a high-quality InGaN-containing active region. Further, the superlattice is known to influence the operating voltage of the device. Appropriate choice of superlattice thickness and composition parameters can reduce operating voltage and increase optical efficiency.

The superlattice structure 16 may be grown in an atmosphere of nitrogen or other gas, which enables growth of higher-quality InGaN layers in the structure. By growing a silicon-doped InGaN/GaN superlattice on a silicon-doped GaN layer in a nitrogen atmosphere, a structure having improved crystallinity and/or conductivity with optimized strain may be realized.

In general, GaN-based layers in the structure may be grown using ammonia as a source gas together with a carrier gas(es) such as hydrogen ($H_2$), nitrogen ($N_2$), an inert gas(es), and/or mixtures thereof.

The active region 18 includes multiple light emitting wells that include thin layers of low bandgap semiconductor material sandwiched by high bandgap cladding or confinement layers, and that may in some embodiments be quantum wells. As is known in the art, a quantum well layer is a very thin layer of semiconductor material, typically less than about 50 nm, surrounded by barrier or confinement layers having higher bandgaps than the quantum well layer. The barrier layers and the quantum well layer together form a quantum well. In particular, a quantum well layer is so thin that allowable energy levels in the quantum well take on discrete values, so that a quantum well exhibits a substantial density of states at the lowest allowed (discrete) energy level compared to bulk material, which has a smooth distribution of allowable energy levels. A quantum well may generate photons by carrier recombination with improved efficiency and/or spectral purity as compared to bulk recombination/emission. Carrier recombination occurs when an electron fills a space in a crystal lattice occupied by a hole and moves to a lower energy state, releasing energy in the form of heat and/or light. In various embodiments, the wells may or may not be thin enough to be characterized as quantum wells, and the present invention is not limited to active regions including quantum wells.

In particular embodiments of the present invention, the active region 18 includes a multiple well structure that includes multiple InGaN well layers separated by barrier layers (not shown in FIG. 1).

In an LED as illustrated in FIG. 1, minority carriers (e.g., holes) are injected from a P-N junction 50 positioned at or near the active region 18 into the active region 18. The injected minority carriers (e.g., holes) may diffuse into one of the quantum wells in the active region 18, where they can recombine with majority carriers (e.g., electrons), resulting in the generation of photons of light. The P-N junction may be positioned close enough to the active region 18 that an injected minority carrier can diffuse with a high probability into the active region 18 and recombine with a majority carrier in a quantum well. In particular, the P-N junction 50 may be positioned between about 0 and 50 nm from the active region 18.

Although the active region 18 can have a structure that is superficially similar to a superlattice, the active region 18 can be distinguished from the superlattice structure 16 in a number of ways. In particular, the band gaps of the well layers in an well-based active region structure are typically the lowest of any layer in the device, so that carrier recombination is most likely to occur in a well layer. The band gaps of the well layers in a well-based structure are tailored to produce a desired wavelength of light emission. Furthermore, the active region 18 may be located closer to the P-N junction of the device than the superlattice structure 16. Also, the superlattice structure 16 may be doped for conductivity, while the active region layers are typically only unintentionally doped.

According to some embodiments, the wells in the active region 18 may have one or more properties, such as well thickness, well bandgap, material composition and/or barrier layer thickness, that vary with distance from the P-N junction, as will be described in greater detail below. In some embodiments, the one or more properties may be tailored to increase carrier recombination in some quantum wells at various current densities, as explained in more detail below.

A barrier layer 22 is provided on the active region 18 and may include a layer of undoped GaN, AlGaN and/or AlInGaN having a thickness between about 0 and 300 Å inclusive. As used herein, "undoped" refers to a layer or region that is not intentionally doped with impurities. It will be appreciated that Group III nitride based materials are typically naturally n-type as grown, and therefore the barrier layer 22 may be n-type as grown. The barrier layer 22 may be about 40 Å or more thick. If the barrier layer 22 comprises AlGaN, the aluminum percentage in such layer may be about 0-70% and in some cases about 55% or less. The level of aluminum in the barrier layer 22 may also be graded in a stepwise or continuously decreasing fashion. The barrier layer 22 may be grown at a higher temperature than the growth temperatures in multiple quantum well active region 18 in order to improve the crystal quality of layer 22. Additional layers of undoped GaN, AlGaN and/or AlInGaN may be included in the vicinity of the barrier layer 22. For example, the LED 40 may include an additional layer of undoped AlGaN about 6-9 Å thick between the active region 18 and the barrier layer 22.

A nitride based layer 30 of, for example, AlGaN and/or AlInGaN doped with a p-type impurity such as magnesium is provided on the barrier layer 22. The layer 30 may be between about 0 and 300 Å thick inclusive and in some cases may be about 150 Å thick. A contact layer 32 of, for example, p-type GaN is provided on the layer 30 and may be about 500-2500 Å, and in some embodiments about 1800 Å thick.

A P-N junction 50 may be formed at a junction between the layer 30 and the layer 22. However, in some embodiments, it is possible to omit the layer 30 so that a P-N junction 50 may be formed between the contact layer 32 and the barrier layer 22. In further embodiments, a P-N junction 50 may be formed within the barrier layer 22 by doping an upper portion thereof with p-type dopants. The P-N junction serves as the mechanism for injecting minority carriers into the active region 18, where they can recombine with majority carriers to generate photons (light).

Ohmic contacts 24 and 25 are provided on the contact layer 32 and the substrate 10, respectively.

Figure 2:
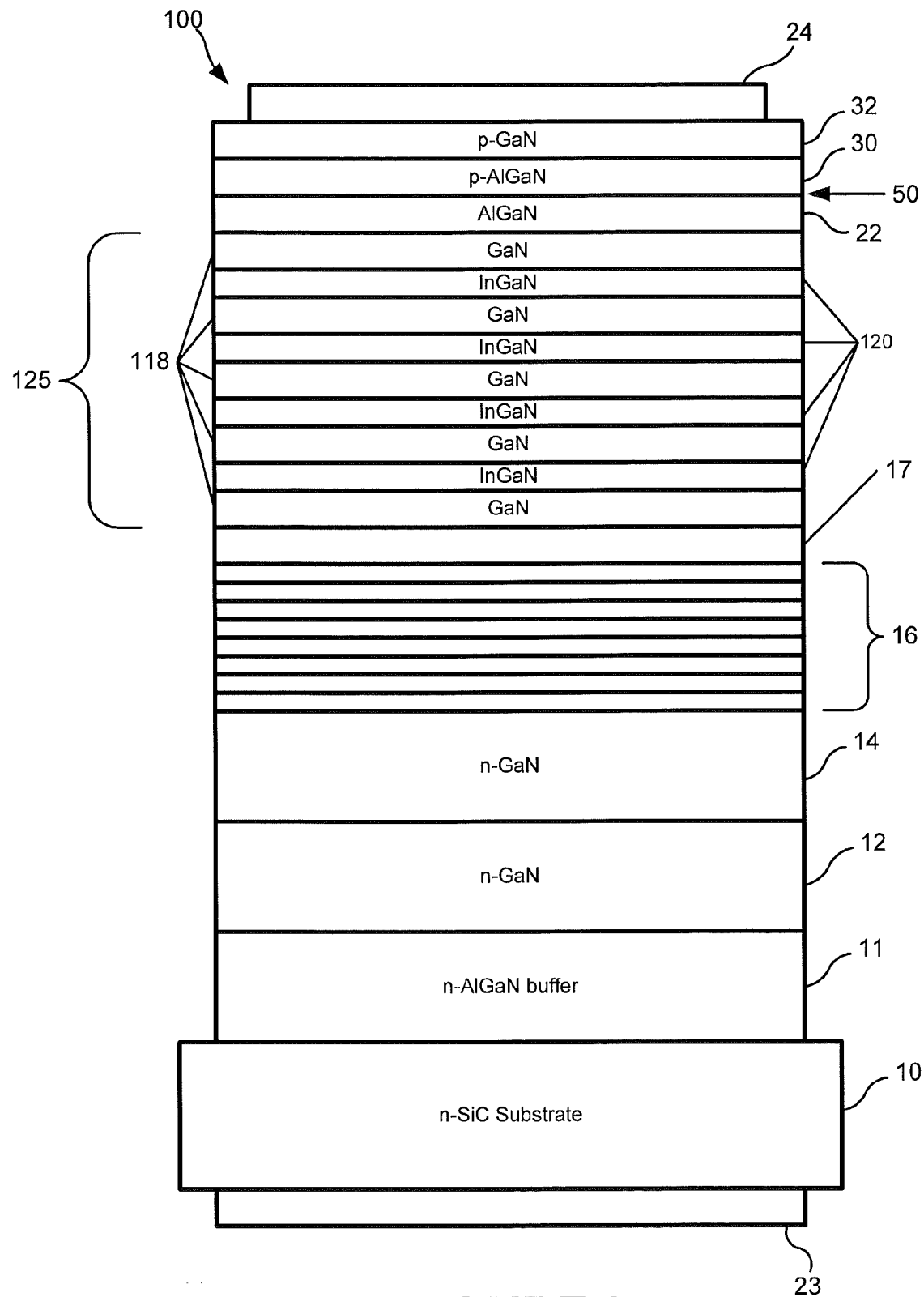
FIG. 2 is a schematic illustration of a Group III nitride light emitting diode incorporating further embodiments.

FIG. 2 illustrates embodiments of the present invention incorporating a multiple quantum well active region in further detail. The embodiments of the present invention illustrated in FIG. 2 provide a layered semiconductor structure 100 including gallium nitride-based semiconductor layers grown on a substrate 10. As described above, the substrate 10 is optional and may be SiC, sapphire, silicon, bulk gallium nitride, etc. As is illustrated in FIG. 2, LEDs according to particular embodiments of the present invention may include a buffer layer 11, a first silicon-doped nitride layer 12, a second silicon-doped nitride layer 14, and a superlattice structure 16 including alternating layers of silicon-doped GaN and/or InGaN. The structure 100 further includes a multiple quantum well active region 125. An undoped nitride barrier layer 22 is formed on the active region 125, a nitride layer 30 is on the barrier layer 22, and a nitride contact layer 32, doped with a p-type impurity, is on the layer 30. In some embodiments, some portions of the layer 30 may also be doped with a p-type impurity. The LEDs may further include an n-type ohmic contact 23 on the substrate 10 and a p-type ohmic contact 24 on the contact layer 32. In embodiments of the present invention where the substrate 10 is sapphire, the n-type ohmic contact 23 may be provided on the n-type nitride layer 12 and/or the n-type nitride layer 14.

The active region 125 includes a multiple well structure that includes multiple InGaN well layers 120 separated by intervening barrier layers 118 in an alternating fashion. The barrier layers 118 may include $In_xGa_{1-x}N$ where $0 \leq X < 1$. However, the indium composition of the barrier layers 118 may be less than that of the well layers 120, so that the barrier layers 118 have a higher bandgap than well layers 120. The barrier layers 118 and well layers 120 may be undoped (i.e. not intentionally doped with an impurity atom such as silicon or magnesium). However, it may be desirable to dope the barrier layers 118 with silicon at a level of less than $5 \times 10^{19}$ $cm^{-3}$, particularly if ultraviolet emission is desired.

In further embodiments of the present invention, the barrier layers 118 include $Al_xIn_yGa_{1-X-Y}N$ where $0 < X < 1$, $0 \leq Y < 1$ and $X+Y \leq 1$. By including indium in the crystal of the barrier layers 118, the barrier layers 118 may be lattice-matched to the well layers 120, thereby providing improved crystalline quality in the well layers 120, which increases the luminescent efficiency of the device. The AlInGaN composition may also help reduce the polarization fields which may help increase electron-hole overlap in the wells, which may lead to more efficient carrier recombination and hence greater light output.

According to some embodiments, the wells in the active region 125 may have one or more properties, such as well thickness, well bandgap, material composition and/or barrier layer thickness, that vary with distance from the P-N junction, as will be described in greater detail below.

In additional embodiments, the LED structure illustrated in FIG. 2 includes an optional spacer layer 17 disposed between the superlattice 16 and the active region 125. The spacer layer 17 may include undoped GaN. Similarly, a spacer layer may also be provided in the LED structure illustrated in FIG. 1 between the superlattice 16 and the active region 18.

Still referring to FIG. 2, the barrier layer 22 may be provided on the active region 125 and may include a Group III-nitride layer, for example undoped GaN or AlGaN, between about 0 Å and 350 Å thick inclusive. The barrier layer 22 may be about 35 Å thick in some embodiments. If the barrier layer 22 comprises AlGaN, the aluminum percentage in such layer may be about 10-70% and in some embodiments may be about 55%. The level of aluminum in the barrier layer 22 may also be graded in a stepwise or continuously decreasing fashion. Accordingly, in some embodiments, the barrier layer 22 may include $Al_xGa_{1-x}N$ where x is graded from 0 at the interface with the adjoining GaN layer 118 up to about 0.1 to 0.7. The barrier layer 22 may be grown at a higher temperature than the growth temperatures in the active region 125 in order to improve the crystal quality of the barrier layer 22. Additional layers of undoped GaN or AlGaN may be included in the vicinity of the barrier layer 22. For example, the LED illustrated in FIG. 2 may include an additional layer of undoped AlGaN about 6-9 Å thick between the active regions 125 and the barrier layer 22.

A nitride-based layer 30 doped with a p-type impurity such as magnesium is provided on the barrier layer 22. The layer 30 may include AlGaN and may be between about 0 Å and 300 Å thick inclusive and in some cases may be about 150 Å thick. A contact layer 32 of, for example, p-type GaN, is provided on the layer 30 and may be about 500 to 2500 Å thick, and in some embodiments may be about 1800 Å thick. Ohmic contacts 24 and 25 are provided on the p-GaN contact layer 32 and the substrate 10, respectively.

Figure 3A:
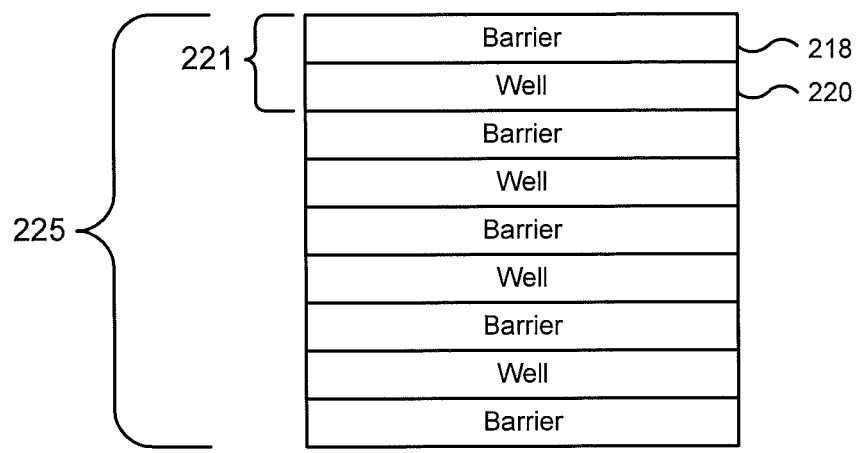
FIGS. 3A and 3B are schematic illustrations of portions of a multiple quantum well structure according to some embodiments.
Figure 3B:
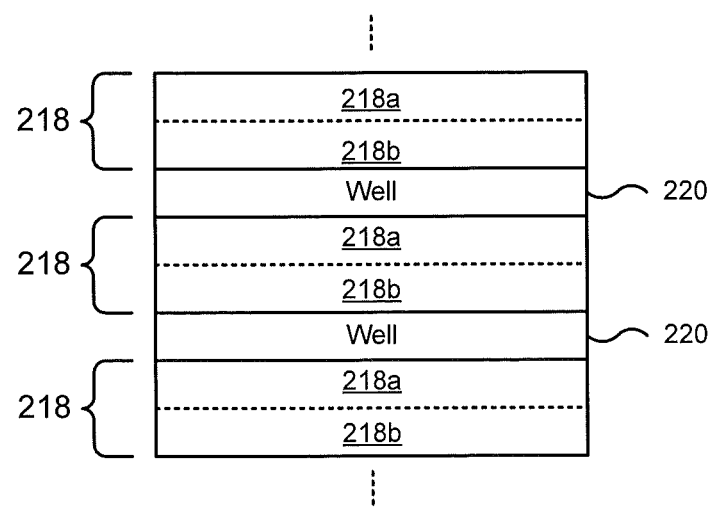

Referring to FIGS. 3A and 3B, embodiments of the present invention that provide a multiple well structure of a gallium nitride based device are illustrated in further detail. The multiple well structures illustrated in FIGS. 3A and 3B may provide the active region of the LEDs illustrated in FIG. 1 and/or FIG. 2. Referring to FIG. 3A, a multiple well active region 225 may include a periodically repeating structure 221 of layers including a well layer 220 and a barrier layer 218 on the well layer 220. In particular, the barrier layer 218 may be positioned between the well layer 220 and the P-N junction of the device. Furthermore, each well layer 220 may be positioned between a pair of barrier layers 218.

Referring to FIG. 3B, each barrier layer 218 may include a well support layer 218a having high crystal quality and a cap layer 218b that serves as a protective cap layer for the quantum well layer 220 beneath the barrier layer 218. That is, when the structure 221 is grown, the cap layer 218b and the well support layer 218a may together form the barrier layer 218 between adjacent wells 220. In some embodiments, the high quality well support layer 218a is grown at a higher temperature than that used to grow the InGaN quantum well layer 220. In some embodiments, the well support layer 218a is grown at a slower growth rate than the cap layer 218b. In other embodiments, lower growth rates may be used during the lower temperature growth process and higher growth rates utilized during the higher temperature growth process. For example, in order to achieve a high quality surface for growing the InGaN well layer 220, the well support layer 218a may be grown at a growth temperature of between about 700° C. and 900° C. Then, the temperature of the growth chamber is lowered by from about 0° C. to about 200° C. to permit growth of the high-quality InGaN quantum well layer 220. Then, while the temperature is kept at the lower InGaN growth temperature, the cap layer 218b is grown. In that manner, a multiple well region comprising high quality InGaN layers may be fabricated.

According to some embodiments, the quantum well layers 220 and/or the barrier layers 218 in the active region 225 may have thicknesses that vary with position in the structure, as will be described in greater detail below.

The active regions 125 and 225 of FIGS. 2, 3A and 3B may be grown in a nitrogen containing atmosphere, which may provide increased InGaN crystal quality. The well support layers 218a and/or the cap layers 218b may be between about 50-250 Å thick inclusive. The combined thickness of corresponding ones of the well support layers 218a and the cap layers 218b may be from about 50-250 Å thick inclusive. In some embodiments, the well support layers 218a and/or the cap layers 218b may be greater than about 90 Å thick and in particular may be about 120 Å thick. Also, in some embodiments, the well support layers 218a may be thicker than the cap layers 218b. Thus, the cap layers 218b may be formed to be as thin as possible while still reducing the desorption of indium from, or the degradation of, the well layers 220. The well layers 120 and 220 may be between about 10-50 Å thick inclusive. The well layers 120 and 220 may in some embodiments be greater than about 20 Å thick and in some embodiments may be about 25 Å thick. The thickness and percentage of indium in the well layers 120 and 220 may be varied to produce light having a desired wavelength. Typically, the percentage of indium in well layers 120 and 220 is about 25-30%, however, depending on the desired wavelength, the percentage of indium may be varied from about 5% to about 50%.

In some embodiments, the bandgap of the superlattice structure 16 exceeds the bandgap of the quantum well layers 120. This may be achieved, for example, by adjusting the average percentage of indium in the superlattice 16. The thickness (or period) of the superlattice layers and the average indium percentage of the layers should be chosen such that the bandgap of the superlattice structure 16 is greater than the bandgap of the wells 120. By keeping the bandgap of the superlattice 16 higher than the bandgap of the wells 120, unwanted absorption in the device may be reduced and luminescent emission may be increased. The bandgap of the superlattice structure 16 may be from about 2.95 eV to about 3.35 eV. In some embodiments, the bandgap of the superlattice structure 16 is about 3.15 eV.

According to some embodiments, the structure of the active region of an LED device may be tailored to enhance the recombination of majority and minority carriers in the multiple wells, to thereby increase light output when the device is energized. In particular, the inventors have determined that the structure of the active region can be altered to increase carrier recombination for different levels of current injection into the active region. For example, the structure of the active region can be tailored to increase carrier recombination, and therefore increase radiant flux of light emitted by the structure. In particular embodiments, carrier recombination can be enhanced for high current applications, however, carrier recombination may also be enhanced for applications other than high current applications.

As electrical bias on the device is increased, the internal electric fields within the device change due to increased screening and filling of available states in the active region quantum wells. As a result of the change in internal electric fields, some types of wells may provide more efficient carrier recombination than others at higher current densities. Some embodiments take advantage of this phenomenon by providing multiple wells having different characteristics, such as different well thicknesses, barrier layer thicknesses, well bandgaps and/or well material compositions. In a device according to some embodiments, some wells in the device may be more efficient at lower current densities, while other wells in the device may be more efficient at higher current densities.

In order to maintain the spectral purity of light output by the device, the wells may be tailored to produce light having a desired wavelength despite their differing physical characteristics. Accordingly, a device according to some embodiments may generate light having a relatively small FHWM characteristic. FWHM, which stands for "full width half maximum" is typically measured in nanometers, and is a measure of the spectral purity of a light source, where smaller values of FWHM indicate a higher degree of spectral purity. An LED according to some embodiments may have a FWHM of 30 nm or less, and in some embodiments a FWHM of 20 nm or less, despite having quantum wells with differing physical characteristics. This may be contrasted with so-called "broad spectrum" LEDs that include quantum wells configured to emit different colors of light, to thereby generate broad spectrum light from a single chip.

According to some embodiments, internal quantum efficiency of a Group III nitride based semiconductor light emitting diode may be increased for high current operation by varying the thicknesses of the well regions of the multiple well active region. In particular, the thickness of the well layers 120, 220 may be increased in well layers closer to the P-N junction that is formed at or near the active region 125, 225. That is, in certain embodiments, well layers that are positioned closer to the p-type layers of the device structure may have a greater thickness than well layers that are positioned farther from the p-type layers of the device structure. The present inventors have found that forming the well layers in this manner can increase the device efficiency and/or the brightness of light emitted by the LED at higher operating currents.

Epitaxial layer structures for Group III nitride based LEDs are typically formed by growing the n-type (and undoped) layers first, then growing the p-type layers on the n-type layers, to avoid reactor memory effects which can cause p-type dopants to remain in the system even after the flow of the source gas for such dopants has been switched off. Thus, for example, an LED structure such as the structure 100 illustrated in FIG. 2 is typically formed by epitaxially growing the buffer layer 11, n-GaN layers 12, 14, the superlattice 16, the active region 125, the barrier layer 22, the p-AlGaN layer 30 and the contact layer 32, in order on a growth substrate. Therefore, in some embodiments, layers of the active region 125, 225 that are formed first may have smaller thicknesses, while layers of the active region 125, 225 that are formed later may have larger thicknesses.

The thickness of a well layer in an active region of a Group III nitride based device may be extremely small, typically less than about 50 Å. However, the thickness of the well layers can be accurately controlled by controlling the growth time of the layers, for example, the amount of time during which reaction gases, such as trimethyl gallium (TMG), trimethyl indium (TMI), trimethyl aluminum (TMA), and ammonia ($NH_3$) are supplied in a chemical vapor deposition (CVD) reaction chamber. The emission wavelength from a well may change both with changing well thickness as well as with the energy depth, or bandgap, of the well. As discussed above, it may be desirable for all of the wells in a device to emit substantially the same wavelength of light, so that the FWHM of the device is not increased to an undesirable amount. To maintain the same, or substantially similar, emission wavelength from all the wells in the various structures described herein, the material composition of the wells may be changed. Changing the material composition in a well changes the bandgap of the quantum well. For example, the indium composition in each well may be tailored to maintain a desired emission wavelength, despite differences in, for example, well thickness. In some embodiments, the indium concentration can be decreased as the well thickness is increased. Decreasing the indium concentration increases the bandgap of the well layer material, partially or completely offsetting changes to the emission wavelength caused by increasing the thickness of the well layer.

Figure 4A:
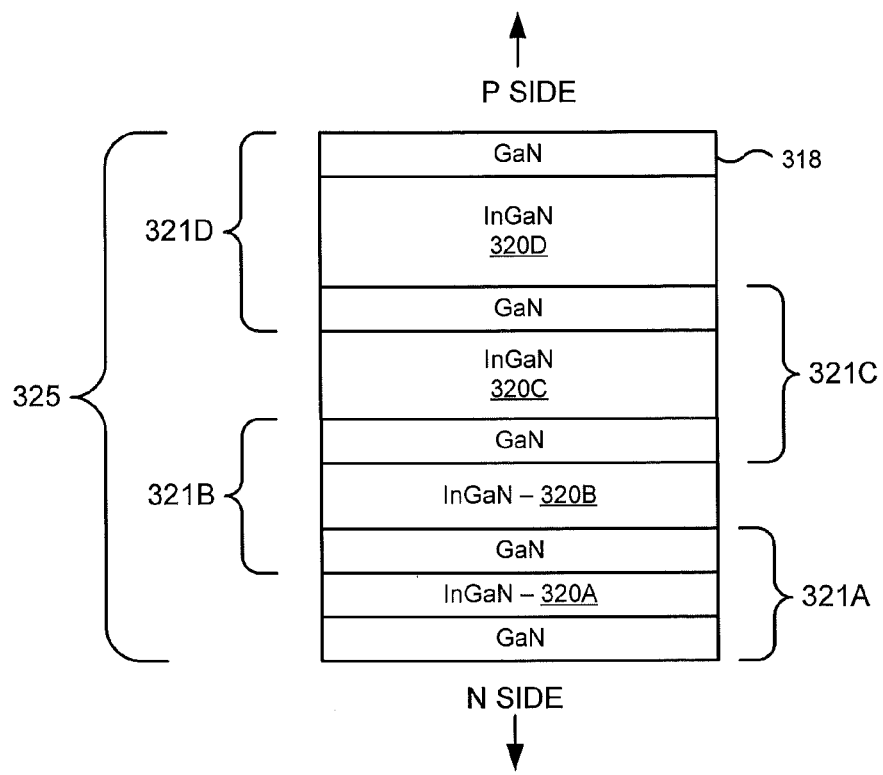
FIG. 4 is a schematic illustration of a multiple quantum well structure according to some embodiments.

Multiple well active regions having wells of varying thicknesses according to some embodiments are illustrated in FIGS. 4A, 4B, 4C, 4D, 5A and 5B. For example, a multiple well active region 325 according to some embodiments is illustrated in FIG. 4A. As shown therein, the active region 325 has a layered structure including four well groups 321A to 321D, each of which includes a well layer 320A to 320D that is positioned between respective barrier layers. Although the structure 325 has only four quantum well layers, it will be appreciated that an structure according to some embodiments can have any plural number of well layers, and in particular embodiments may have ten (10) or more well layers therein.

The P-N junction of the device may be above the active region 325 (i.e., on the P-side of the device relative to the active region 325). However, in some embodiments, the P-N junction may be positioned within the active region 325 or below the active region 325 on the N-side of the device relative to the active region 325. In some embodiments, the P-N junction of the device can be positioned on the P-side of the device between about 0 Å and 500 Å from the active region 325.

As illustrated in FIG. 4A, the well layers 320A to 320D, which are separated by barrier layers 318, have thicknesses that vary from the N-side of the device to the P-side of the device. Namely, the well layers 320A to 320D have thicknesses that decrease with distance from the P-side of the device. In the embodiments illustrated in FIG. 4A, the well layers 320A to 320D have thicknesses that decrease linearly with distance from the P-side of the device. In some embodiments, the thicknesses decrease with distance from the P-N junction. From the perspective of growth order of the layers, the well layers 320A to 320D of the active region 325 have thicknesses that increase from a first thickness (T1) for the first well layer 320A to a second thickness (T2) for the last well layer 320D, wherein the second thickness T2 is larger than the first thickness T1. Thus, in one aspect, the well layers 320A to 320D of the active region 325 may have thicknesses that increase from a first thickness (T1) for the first well layer 320A to a second thickness (T2) for the last well layer 320D with increasing distance from an underlying n-GaN layer, such as the n-GaN layer 16 illustrated in FIG. 2.

Providing well layers 320A to 320D with thicknesses that decrease with distance from the P-side of the device may result in enhanced recombination of carriers in the active region 325 depending on the current through the device. For example, the thickness may decrease in a stepwise linear fashion from well to well with distance from the P-side of the device (i.e. the thickness may decrease in regular intervals from well to well). In this context, "linear" means that the well thickness increase or decrease by a fixed amount from well to well. However, the well layers 320A to 320D may be provided with thicknesses that decrease with distance from the P-side of the device in a nonlinear manner, while still obtaining enhancement of carrier recombination resulting in increased brightness. In fact, providing quantum well layers in an structure with thicknesses that decrease with distance from the P-side of the device in a nonlinear manner may increase carrier recombination even more than structures with well thicknesses that vary linearly.

Figure 4B:
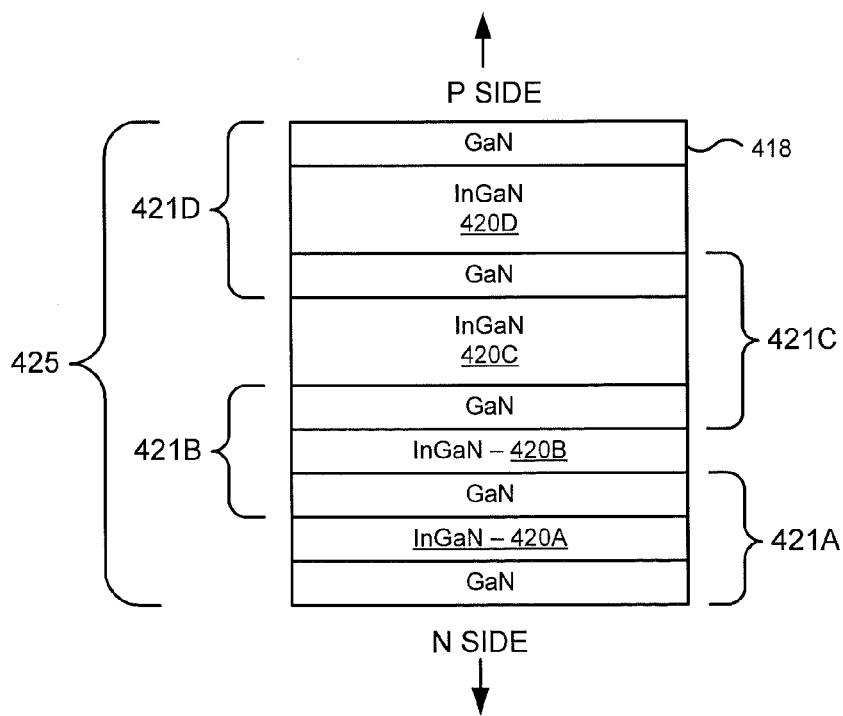

Nonlinear variation of well thickness can include variation in many ways, such as a non-monotonic manner, a step function, an exponential manner, a piecewise linear manner, alternating thicknesses, or any other manner. increase efficiency based on operating current For example, referring to FIG. 4B, an active region 425 according to some embodiments has a layered structure including four well groups 421A to 421D, each of which includes a well layer 420A to 420D that is positioned between respective barrier layers 418. The P-N junction of the device may be above the active region 425 (i.e., on the P-side of the device relative to the active region 425). However, in some embodiments, the P-N junction may be positioned within the active region 425 or below the active region 425 on the N-side of the device relative to the active region 425.

The well layers 420A to 420D have thicknesses that decrease nonlinearly with distance from the P-side of the device. In particular, the two well layers 420A, 420B that are farthest from the P-side of the device have a first thickness T1, while the two well layers 420C, 420D that are closest to the P-side of the device have a second thickness T2 that is larger than the first thickness T1.

In some embodiments, the first thickness T1 may be about 20 Å, while the second thickness T2 may be about 30 Å. In general, the first thickness T1 may be from about 15 Å to about 25 Å, while the second thickness T2 may be from about 20 Å to about 35 Å or thicker, although other thickness ranges are possible. In some embodiments, the first thickness T1 may be from about 20 Å to about 25 Å. The second thickness T2 may be about 18% to 40% larger or more than the first thickness T1. In further embodiments, the second thickness T2 may be about 18% to 32% larger than the first thickness T1. In some particular embodiments, the second thickness T2 may be about 25% larger than the first thickness T1.

Figure 4C:
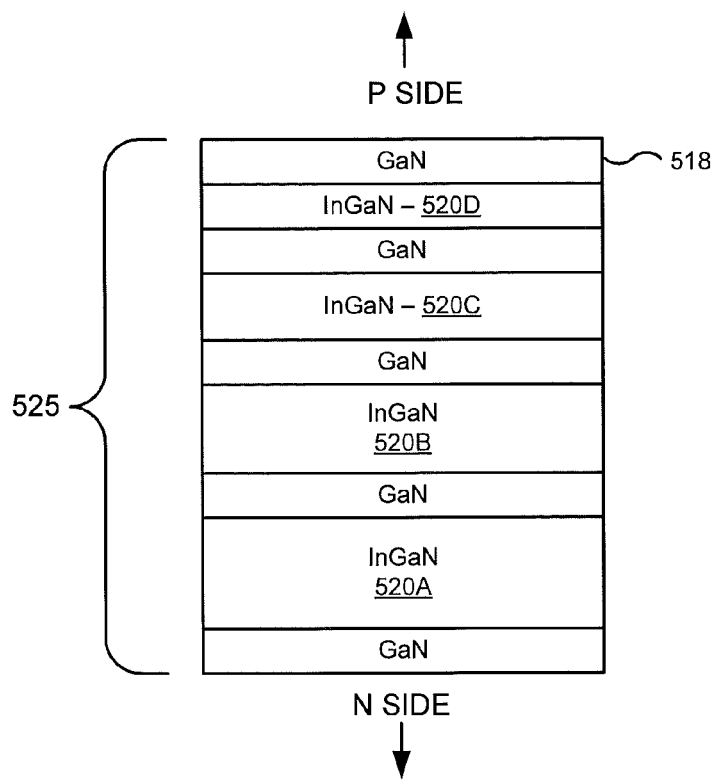
Figure 4D:
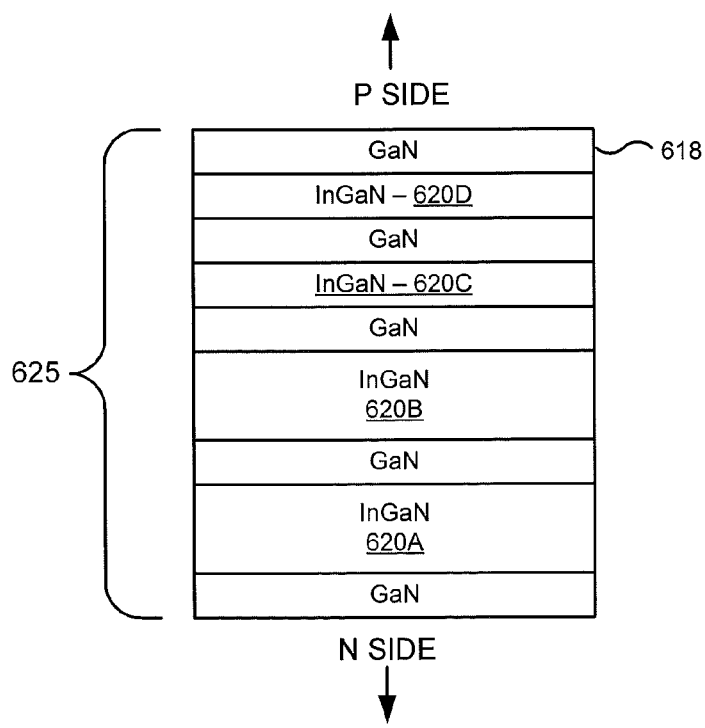
Figure 5A:
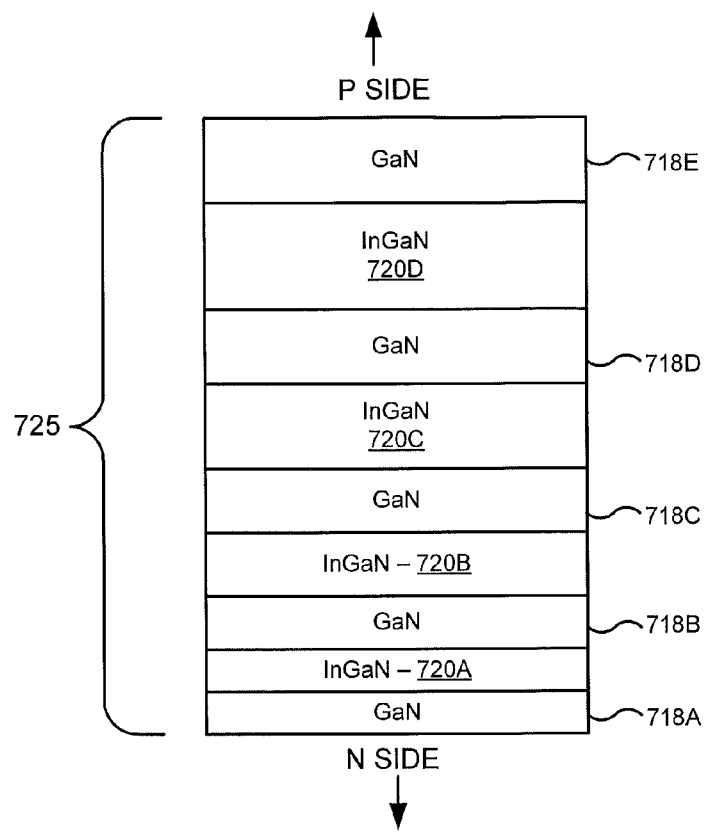
FIG. 5 is a schematic illustration of a multiple quantum well structure according to further embodiments.
Figure 5B:
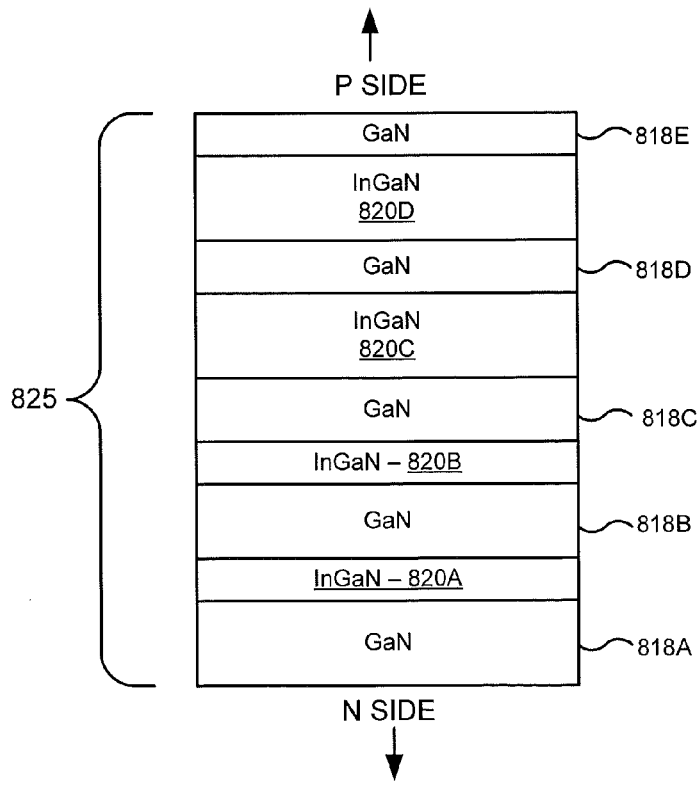

As illustrated in FIGS. 4C and 4D, in some embodiments, the quantum well thickness may increase with proximity to the N-side of the device. For example, FIG. 4C illustrates an active region 525 including quantum well layers 520A to 520D that are separated by barrier layers 518. The well layers 520A to 520D have thicknesses that increase linearly with distance from the P-side of the device (i.e., thicker wells closer to the N-side of the device). FIG. 4D illustrates an active region 625 including well layers 620A to 620D that are separated by barrier layers 618. The well layers 620A to 620D have thicknesses that increase non-linearly with distance from the P-side of the device (i.e., thicker wells closer to the N-side of the device). In particular, in the active region 625, the quantum well layers 620A and 620B which are closer to the N-side of the device have a first thickness, while the quantum well layers 620C and 620D which are closer to the P-side of the device have a second thickness that is less than the first thickness.

In some embodiments, the thicknesses of the barrier layers may vary over the length of the active region. For example, referring to FIG. 5A, an active region 725 includes well layers 720A to 720D that are separated by barrier layers 718A to 718E. The well layers 720A to 720D have thicknesses that increase linearly with distance from the N-side of the device (i.e., thicker wells closer to the P-side of the device). The barrier layers 718A to 718E have thicknesses that also increase with distance from the N-side of the device. That is, the thicknesses of the barrier layers 718A to 718E increase as the thicknesses of the well layers 720A to 720D increase.

In further embodiments, the thicknesses of the barrier layers may decrease as the thicknesses of the well layers increase. For example, referring to FIG. 5B, an active region 825 includes well layers 820A to 820D that are separated by barrier layers 818A to 818E. The well layers 820A to 820D have thicknesses that increase linearly with distance from the N-side of the device (i.e., thicker wells closer to the P-side of the device). Conversely, the barrier layers 818A to 818E have thicknesses that decrease with distance from the N-side of the device. That is, the thicknesses of the barrier layers 818A to 818E decrease as the thicknesses of the well layers 820A to 820D increase.

Well layer thickness profiles according to some embodiments are illustrated in FIGS. 6A to 6H, which are graphs of well thickness as a function of well number for a light emitting device structure according to some embodiments having ten (10) quantum wells in an active region. In FIGS. 6A to 6H, well numbers are lower for wells grown earlier in the structure. Accordingly, wells having higher well numbers may be closer to the P-side of the device.

Recombination of carriers, and therefore internal quantum efficiency, may be enhanced in a light emitting device having one of the well structures illustrated in FIGS. 6A to 6D, in which the well thicknesses increase towards the P-side of the device. In particular, the relative brightness of LEDs having a well structure according to some embodiments may be higher on average than a similar LED having a conventional well structure for devices driven at currents of at least about 20 mA.

Figure 6A:
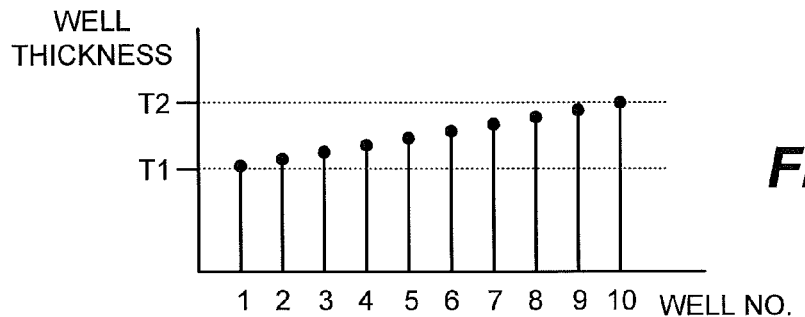
FIGS. 6A, 6B, 6C, 6D, 6E, 6F, 6G, 6E, 6I, 6J and 6K illustrate quantum well thickness variations in multiple quantum well structures according to some embodiments.

FIG. 6A illustrates an LED structure in which the well thicknesses increase linearly from a first thickness of T1 to a second thickness of T2. The structure illustrated in FIG. 6A is therefore similar to the structure illustrated in FIG. 4A.

Figure 6B:
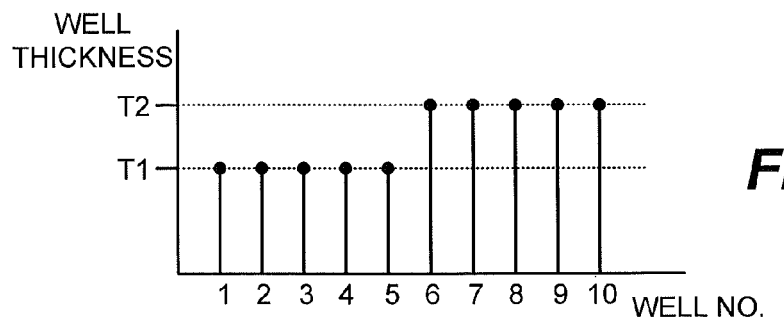

FIG. 6B illustrates a structure in which a first group of wells has a first thickness T1, and a second group of wells has a second thickness T2 that is greater than the first thickness T1. Because the second group of wells are grown after the first group of wells, the second group of wells may be closer to the P-N junction of the device than the first group of wells. The structure illustrated in FIG. 6B is therefore similar to the structure illustrated in FIG. 5A.

Figure 6C:
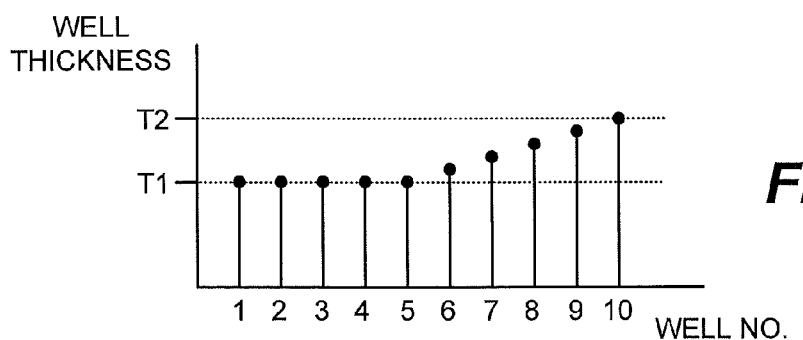

FIG. 6C illustrates a structure in which a first group of wells has a first thickness T1, and a second group of wells has thicknesses that increase linearly from the first thickness T1 to a second thickness T2. The second group of wells may be closer to the P-N junction of the device than the first group of wells.

Figure 6D:
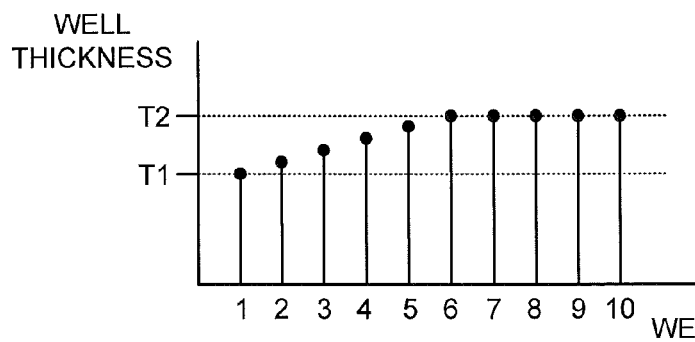

FIG. 6D illustrates a structure in which a first group of quantum wells has thicknesses that increase linearly from the first thickness T1 to a second thickness T2, and a second group of wells having the second thickness T2. The second group of wells may be closer to the P-N junction of the device than the first group of wells.

Figure 6E:
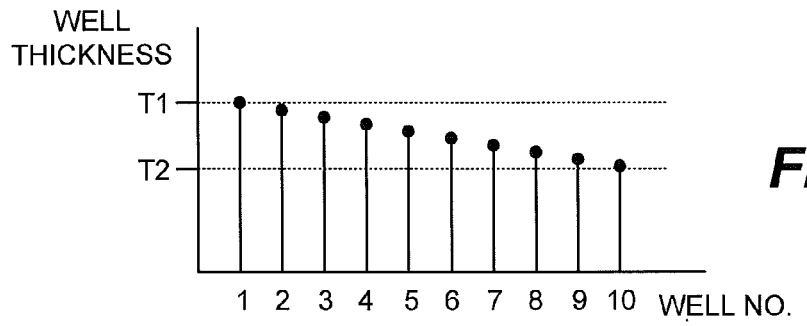
Figure 6F:
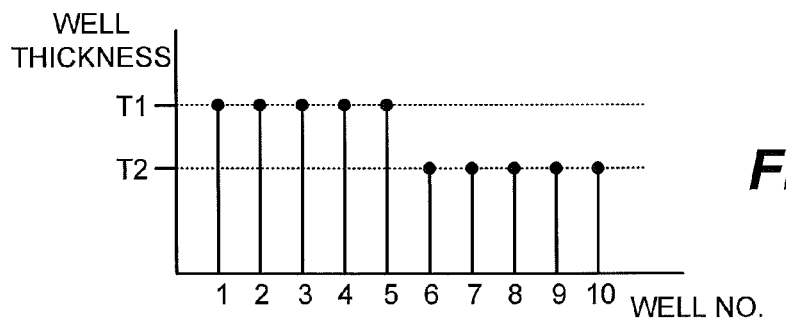
Figure 6G:
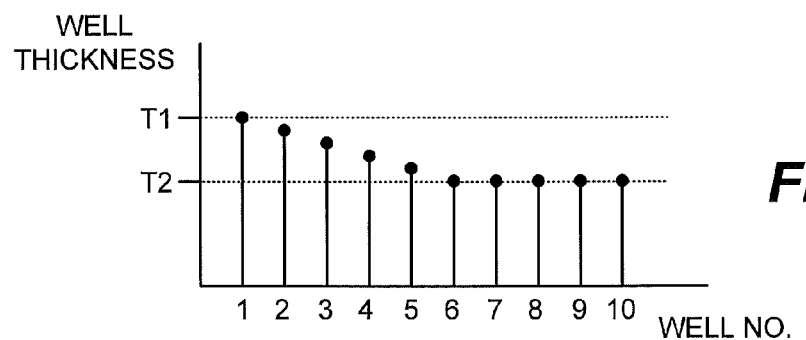
Figure 6H:
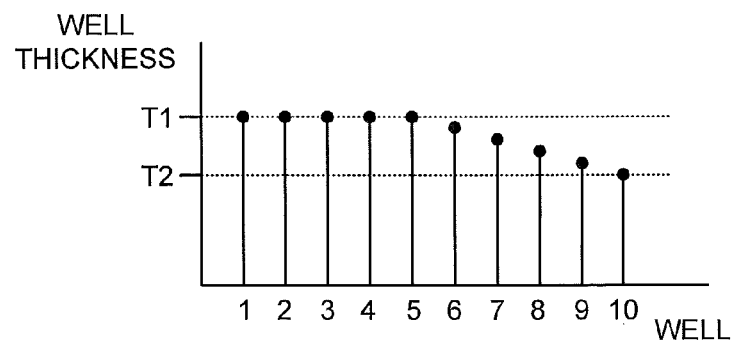

FIGS. 6E-6H illustrate embodiments in which the thicknesses of the quantum wells decrease from a first thickness T1 to a second thickness T2 as the wells are grown. FIG. 6E illustrates linearly decreasing thickness of wells, while FIG. 6F illustrates wells that have thicknesses that decrease in a stepwise fashion. FIGS. 6G and 6H illustrate wells that have thicknesses that decrease in nonlinear fashion.

Figure 6I:
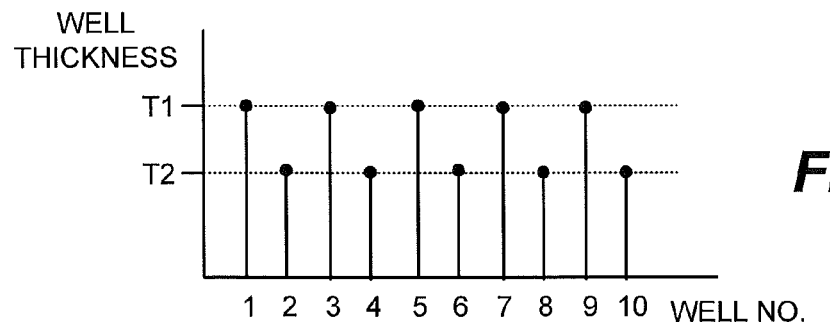
Figure 6J:
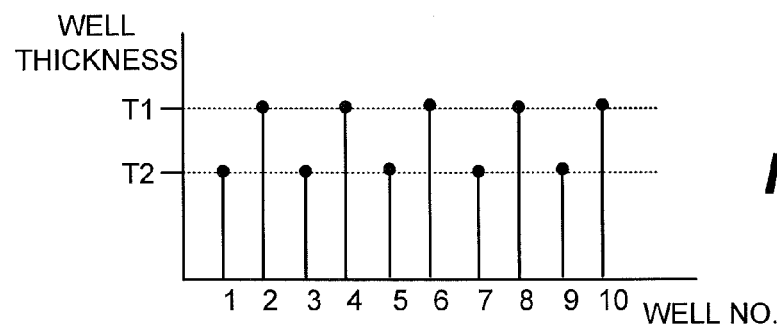
Figure 6K:
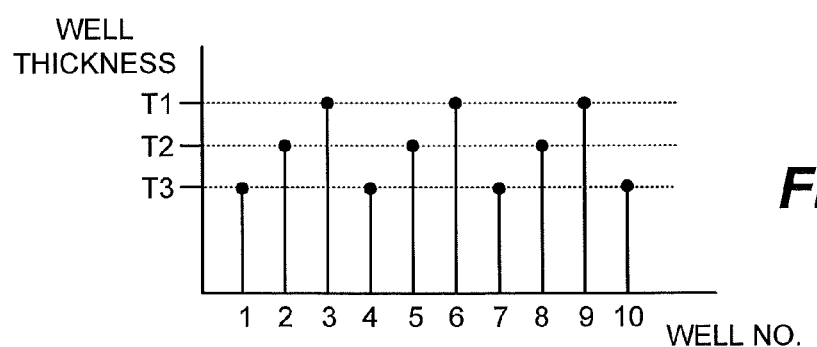

FIGS. 6I-6K illustrate embodiments in which the thicknesses of the quantum wells alternate in various ways. For example, in the embodiments of FIGS. 6I and 6J, the well thicknesses alternate between first and second thicknesses, T1 and T2, while in FIG. 6K, the well thicknesses alternate between first, second and third thicknesses, T1, T2 and T3. Many other variations are possible within the scope of the invention.

Figure 7A:
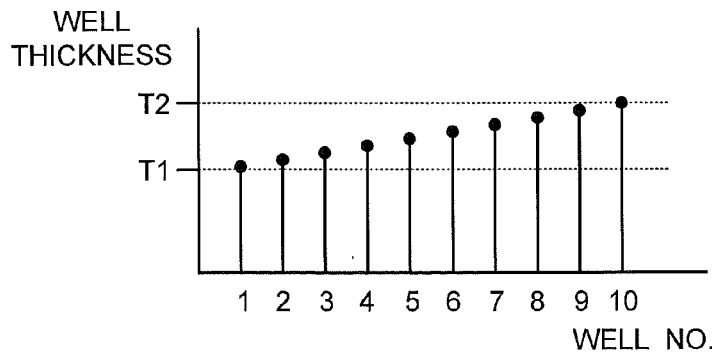
FIG. 7A, illustrates linear well layer thickness variation in multiple quantum well structures according to some embodiments.
Figure 7B:
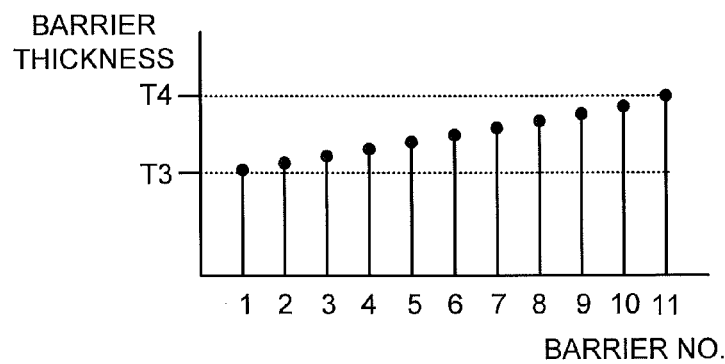
FIGS. 7B, 7C, and 7D illustrate barrier layer thickness variations in multiple quantum well structures according to some embodiments.
Figure 7C:
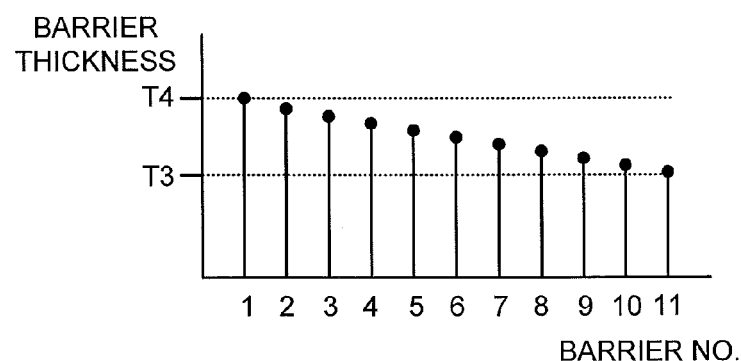
Figure 7D:
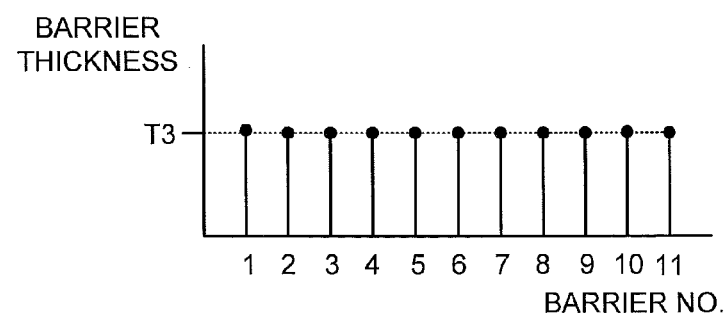

FIGS. 7A to 7D illustrate varying thicknesses of barrier layers according to some embodiments. FIG. 7A illustrates well thicknesses that increase in a linear fashion from a first thickness T1 to a second thickness T2, which may be in a direction toward or away from the P- or N-side of the device. At the same time, the barrier layers that surround the wells may have thicknesses that increase from a first thickness T3 to a second thickness T4 (FIG. 7B), decrease from a second thickness T4 to a first thickness T3 (FIG. 7C) or stay the same (FIG. 7D) as the thicknesses of the well layers increase. In some embodiments, the barrier layers may have a thickness between about 50 Å and 250 Å thick. In particular embodiments, the first thickness T3 may be about 50 Å, while the second thickness T4 may be about 150 Å.

In particular, it may be beneficial to decrease the barrier layer thickness as the well layer thickness is increased. Further, it may be beneficial to decrease the well layer thickness for quantum wells closer to the P-N junction. Decreasing the barrier layer thickness may improve carrier injection, and hence may increase the amount of light generated, at higher current densities. Furthermore, it may be beneficial to grow thicker barrier layers at the bottom of a well structure to enhance the material quality of the well layers.

As noted above, thicker well layers may enhance carrier recombination at high current densities. Although not bound by any particular theory of operation, it is presently believed that undesirable Auger recombination, which becomes more problematic at high current densities, may be reduced by increasing the thickness of the quantum well layers. Auger recombination refers to a type of carrier recombination that produces heat rather than light. Such recombination reduces the internal quantum efficiency of the device, that is, the efficiency at which energetic electrical carriers are converted into useful photons.

Auger recombination is not easily produced, but occurs more at high current levels, as it is a function of the cube of the carrier concentration. Increasing the well thickness is believed to reduce the density of carriers in the well, which reduces the probability of Auger recombination occurring. Auger recombination is believed to be responsible for the characteristic "droop" in quantum efficiency that occurs when LEDs are driven at high current levels. Furthermore, the wider wells may result in less overshoot of the minority carriers that are injected from the P-N junction, which may further improve the efficiency of carrier recombination.

A plurality of LED devices having different well structures were manufactured and tested at both the epitaxial growth stage and the final fabricated device stage. Table 1 illustrates relative growth times for the wells, which correlates to relative thickness of the wells.

4 and 6A, namely, they have a thicknesses that increase linearly from a first thickness to a second thickness. The structures of the LEDs of Group B correspond to the well structures illustrated in FIGS. 4B and 6B, namely, they have a step increase in well thickness from a first thickness to a second thickness.

The structures of the LEDs of Group C correspond to the well structures illustrated in FIG. 6C, while the structures of the LEDs of Group D correspond to the well structures illustrated in FIG. 6D. The structures of the LEDs of Group E have constant well thicknesses.

As further illustrated in Table 1, increasing well thicknesses may also be accompanied by decreasing the amount of indium in the wells by decreasing the flow of trimethyl indium (TMI), the source gas that provides indium, during well growth, thereby increasing the bandgap of the quantum well layers as the quantum well thickness is increased. As noted above, decreasing the indium concentration in the wells can offset changes to the emission wavelength that are caused by increasing the well thicknesses.

Figure 8A:
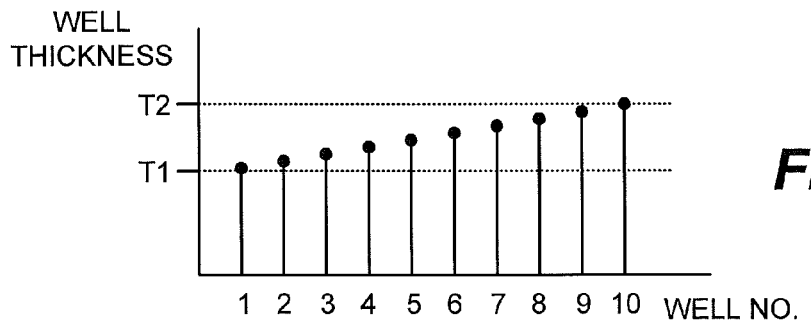
FIGS. 8A, 8B, 9A, and 9B illustrate quantum well thickness variations and corresponding indium composition variations in multiple quantum well structures according to some embodiments.
Figure 8B:
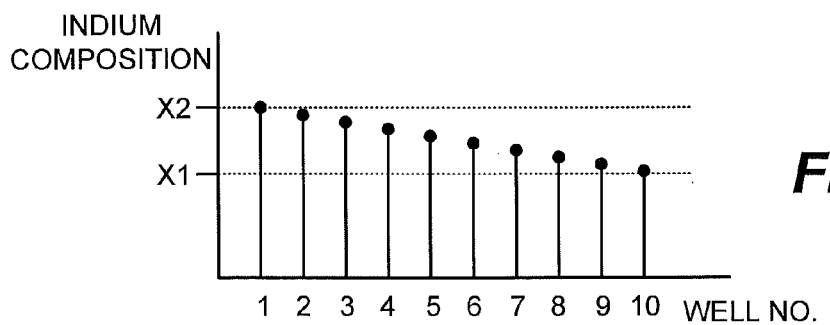

FIGS. 8A and 8B and FIGS. 9A and 9B illustrate relationships between well thickness and indium composition according to some embodiments. For example, as shown in FIGS. 8A and 8B, as the well thickness increases linearly from a first thickness T1 to a second thickness T2, the indium

TABLE 1

Well Structures

| | Well # | | | | | | | | | |
|---|---|---|---|---|---|---|---|---|---|---|
| | 1 | 2 | 3 | 4 | 5 | 6 | 7 | 8 | 9 | 10 |
| LED GROUP A | | | | | | | | | | |
| Well Time | 4 | 4.13 | 4.27 | 4.4 | 4.53 | 4.67 | 4.8 | 4.93 | 5.06 | 5.2 |
| Well TMI | 128.1 | 121.7 | 115.3 | 108.9 | 102.5 | 96.1 | 89.7 | 83.3 | 76.9 | 70.5 |
| LED GROUP B | | | | | | | | | | |
| Well Time | 4 | 4 | 4 | 4 | 4 | 5.2 | 5.2 | 5.2 | 5.2 | 5.2 |
| Well TMI | 128.1 | 128.1 | 128.1 | 128.1 | 128.1 | 70.5 | 70.5 | 70.5 | 70.5 | 70.5 |
| LED GROUP C | | | | | | | | | | |
| Well Time | 4 | 4 | 4 | 4 | 4 | 4 | 4.3 | 4.6 | 4.9 | 5.2 |
| Well TMI | 128.1 | 128.1 | 128.1 | 128.1 | 128.1 | 128.1 | 113.7 | 99.3 | 84.9 | 70.5 |
| LED GROUP D | | | | | | | | | | |
| Well Time | 4.0 | 4.2 | 4.5 | 4.7 | 5.0 | 5.2 | 5.2 | 5.2 | 5.2 | 5.2 |
| Well TMI | 128.1 | 116.6 | 105.1 | 93.5 | 82 | 70.5 | 70.5 | 70.5 | 70.5 | 70.5 |

| | Well # | | | | | | | |
|---|---|---|---|---|---|---|---|---|
| | 1 | 2 | 3 | 4 | 5 | 6 | 7 | 8 |
| LED GROUP E | | | | | | | | |
| Well Time | 5.2 | 5.2 | 5.2 | 5.2 | 5.2 | 5.2 | 5.2 | 5.2 |
| Well TMI | 70.5 | 70.5 | 70.5 | 70.5 | 70.5 | 70.5 | 70.5 | 70.5 |

Table 1 discloses well growth times and indium source gas (TMI) flow rates that may be used to form quantum wells according to some embodiments. It will be appreciated that the particular growth times and flow rates that will be used to form layers having a suitable thickness will depend on the particular epitaxial growth system being used, as well as the growth temperature and other parameters. Optimization of growth parameters to form quantum well layers having desired layer thicknesses as described herein is within the ability of a skilled person.

Figure 9A:
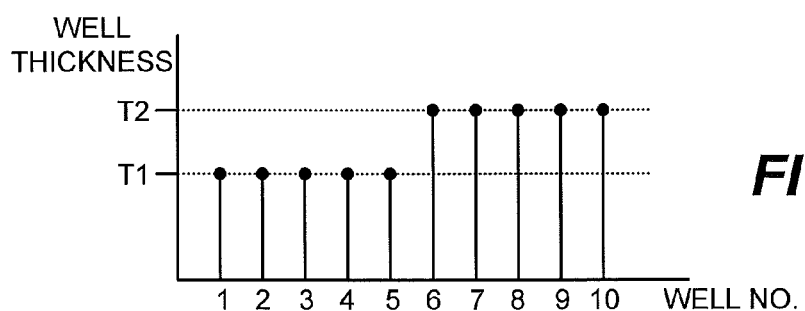
Figure 9B:
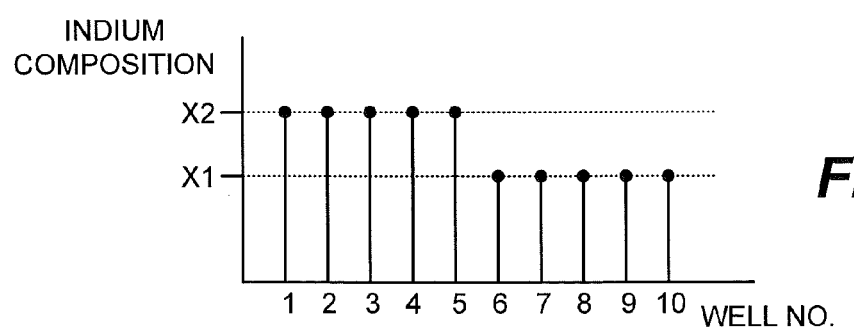

As illustrated in Table 1, the structures of the LEDs of Group A correspond to the well structures illustrated in FIGS.

composition of the wells decreases linearly from a high indium composition X2 to a low indium composition X1. Similarly, as shown in FIGS. 9A and 9B, the well thickness increases from a first thickness T1 for wells 1 to 5 to a second thickness T2 for wells 6 to 10, the indium composition decreases from a high indium composition X2 for wells 1 to 5 to a low indium composition X1 for wells 6 to 10.

In some embodiments, the indium composition in an $In_xGa_{1-x}N$ quantum may vary from X=0.05 to X=0.2.

Figure 10:
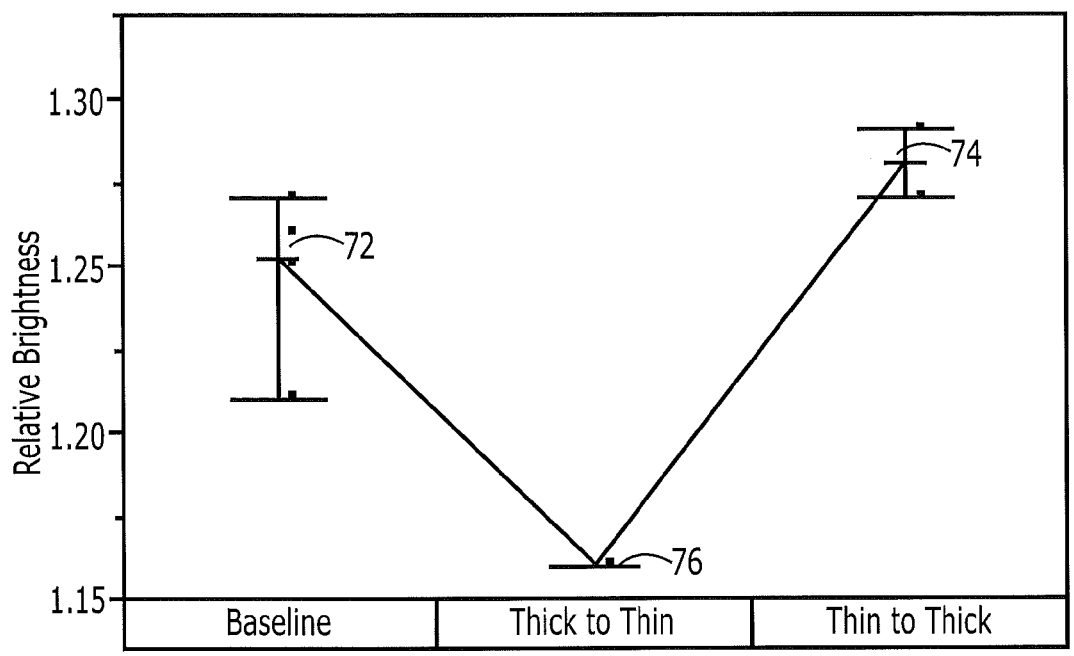
FIG. 10 illustrates variability of brightness for devices having multiple quantum well structures with constant thickness wells and multiple quantum well structures with variable thickness wells according to some embodiments.

FIG. 10 illustrates variability of brightness for devices having multiple well structures with conventional constant thickness wells and for devices having multiple well structures with variable thickness wells according to some embodiments. In particular, group 72 represents relative brightness of light emitting devices of Group E in Table 1 having active regions with constant thickness wells, while group 74 represents relative brightness of LEDs of Group A in Table 1 having wells with thicknesses as illustrated in FIGS. 4A and 6A (i.e. that increase linearly with proximity to the P-N junction). In particular, the devices represented by group 74 have active regions with well thicknesses that increase linearly by a total of about 25% from about 25 Å to about 32 Å.

As illustrated in FIG. 10, the devices of group 74 had an average relative brightness significantly higher than the average relative brightness of the devices of group 72.

FIG. 10 further includes relative brightness of a device (group 76) in which the thickness of the well layers increased linearly with distance from the P-N junction (i.e., wells closer to the P-N junction were thinner—the opposite of the profile illustrated in FIG. 6A). This device exhibited lower relative brightness compared to either the devices of group 72 or the devices of group 74.

Figure 11:
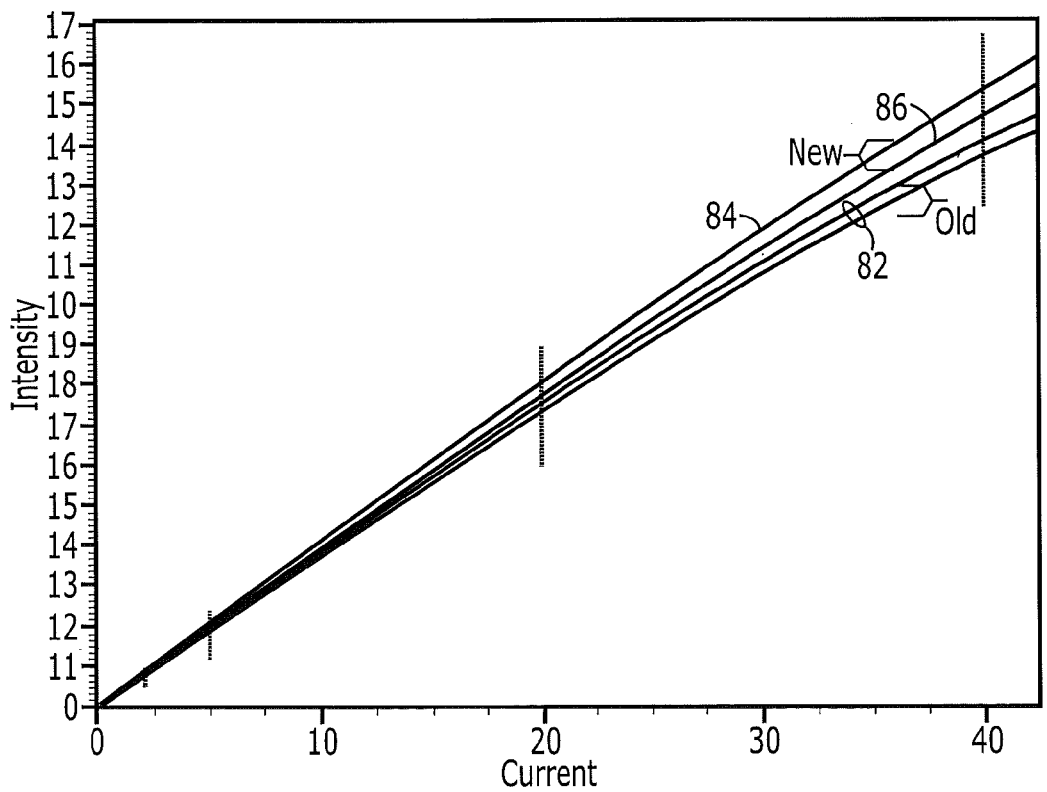
FIG. 11 illustrates curve-fit functions of intensity versus current for devices having multiple quantum well structures with constant thickness wells and multiple quantum well structures with variable thickness wells according to some embodiments.
Figure 12A:
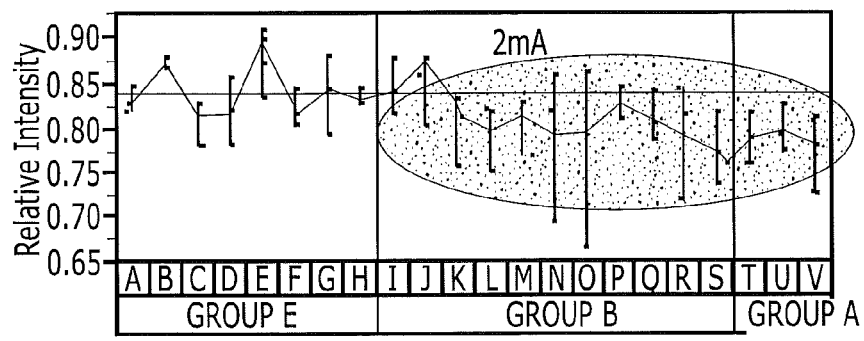
FIGS. 12A, 12B, 12C and 12D illustrate variability of light emission intensity for devices having multiple quantum well structures with constant thickness wells and multiple quantum well structures with variable thickness wells according to some embodiments when driven at forward current levels of 2 mA, 5 mA, 20 mA, and 40 mA, respectively.
Figure 12B:
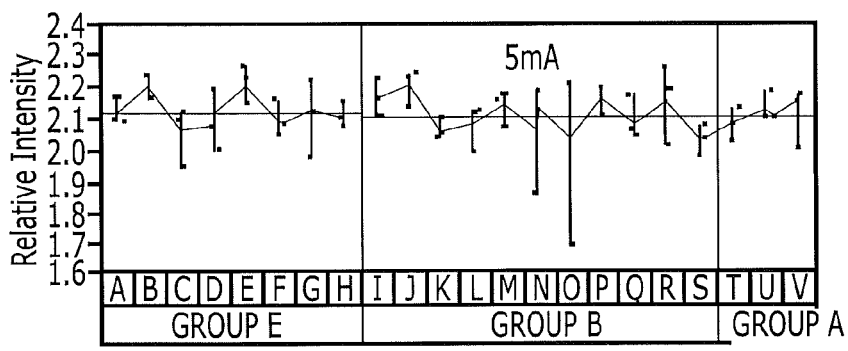
Figure 12C:
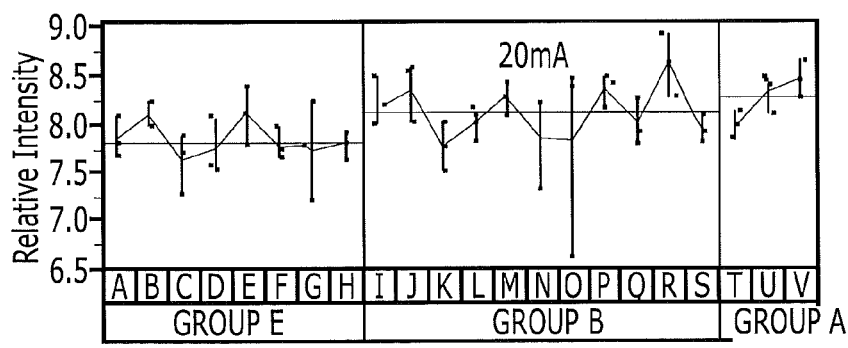
Figure 12D:
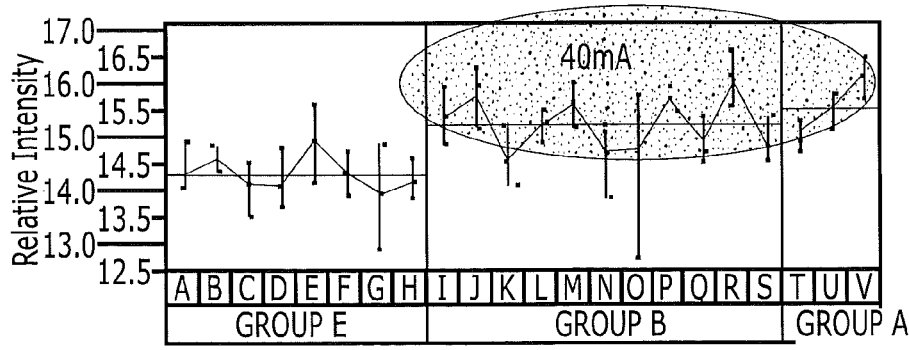

FIG. 11 illustrates curve-fit functions of intensity versus current for devices having multiple well structures with conventional constant thickness wells and for devices having multiple well structures with variable thickness wells according to some embodiments. In particular, curves 82 represent curve-fit functions of intensity versus current for devices having conventional constant thickness quantum well layers in an active region. Curve 84 represents intensity versus current for devices of Group B in Table 1 having wells with a step increase in thickness for wells closer to the P-N junction of the device. Curve 86 represents intensity versus current for devices of Group A in Table 1 having wells that increase in thickness linearly with proximity to the P-N junction of the device. As illustrated in FIG. 11, the light emission from the devices of Groups A and B of Table 1 increase more rapidly with operating current than devices having conventional layer structures.

FIGS. 12A, 12B, 12C and 12D illustrate variability of light emission intensity for devices having multiple well structures with conventional constant thickness wells and for devices having multiple well structures with variable thickness wells according to some embodiments when driven at forward current levels of 2 mA, 5 mA, 20 mA, and 40 mA, respectively. As shown therein, the intensity of emission by the Group B devices increases relative to the other devices with increasing drive current.

Figure 13A:
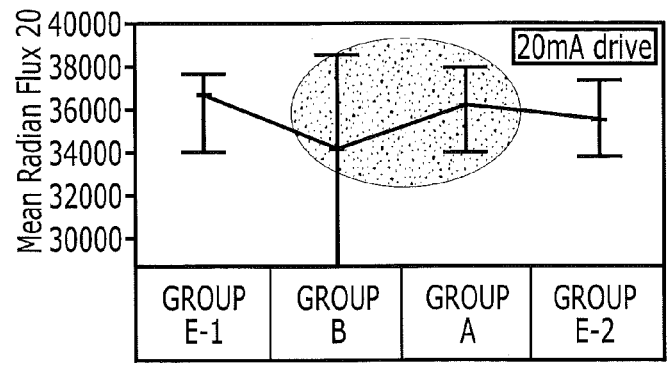
FIGS. 13A, 13B, and 13C illustrate variability of radiant flux for devices having multiple quantum well structures with constant thickness wells and multiple quantum well structures with variable thickness wells according to some embodiments when driven at forward current levels of 20 mA, 50 mA, and 150 mA, respectively.
Figure 13B:
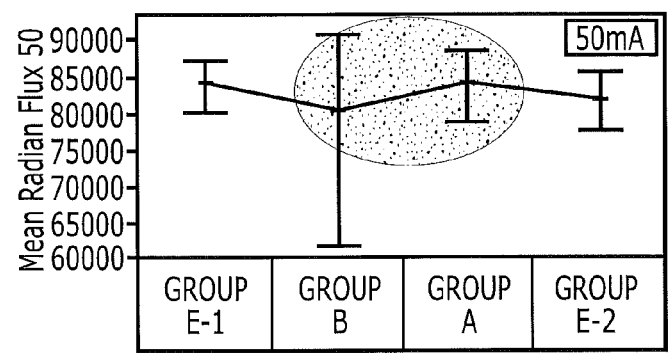
Figure 13C:
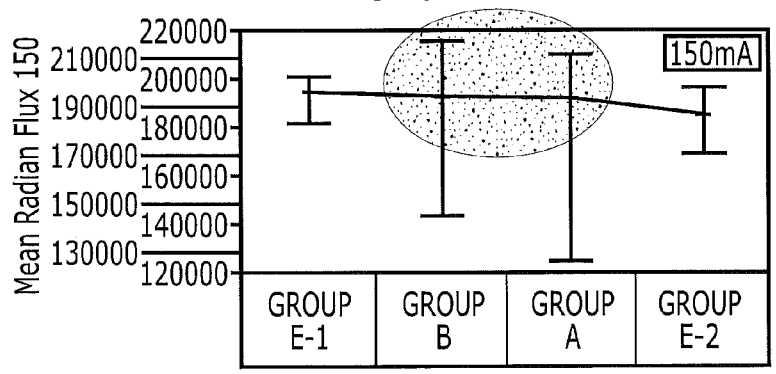
Figure 14:
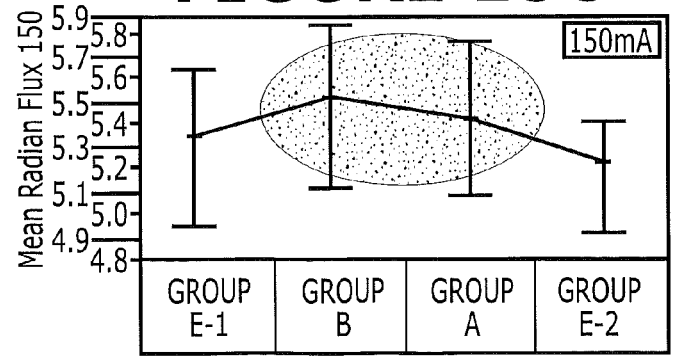
FIG. 14 illustrates ratios of radiant flux measured at 150 mA forward current to radiant flux measured at 20 mA forward current for devices having multiple quantum well structures with constant thickness wells and multiple quantum well structures with variable thickness wells according to some embodiments.

FIGS. 13A, 13B, and 13C illustrate variability of radiant flux for fully fabricated lamps having multiple quantum well structures with conventional constant thickness wells and for lamps having multiple quantum well structures with variable thickness wells according to some embodiments when driven at forward current levels of 20 mA, 50 mA, and 150 mA, respectively. As seen in FIGS. 11A to 11C, the devices of Group B in particular showed significant increase in brightness as the current level was increased to 150 mA. The Group B structure appeared to perform better than the Group A structure FIG. 14 illustrates ratios of radiant flux measured at 150 mA forward current to radiant flux measured at 20 mA forward current for fully fabricated lamps having multiple well structures with conventional constant thickness wells and for lamps having multiple well structures with variable thickness wells according to some embodiments. As illustrated therein, the devices of Group B of Table 1 exhibited, on average, the greatest ratio of radiant flux at 150 mA operating current to radiant flux at 20 mA operating current. The devices of Group A showed an increase in the 150 mA/20 mA flux ratio relative to devices having conventional well structures.

While embodiments of the present invention have been described with reference to gallium nitride based devices, the teachings and benefits of the present invention may also be provided in other Group III nitrides. Thus, embodiments of the present invention provide Group III nitride based superlattice structures, quantum well structures and/or Group III nitride based light emitting diodes having superlattices and/or quantum wells. Furthermore, additional layers/sub-layers besides those illustrated in the figures may be included in devices according to some embodiments. Furthermore, other variations in well thickness besides those explicitly illustrated herein may be possible in some embodiments.

Many different embodiments have been disclosed herein, in connection with the above description and the drawings. It will be understood that it would be unduly repetitious and obfuscating to literally describe and illustrate every combination and subcombination of these embodiments. Accordingly, all embodiments can be combined in any way and/or combination, and the present specification, including the drawings, shall be construed to constitute a complete written description of all combinations and subcombinations of the embodiments described herein, and of the manner and process of making and using them, and shall support claims to any such combination or subcombination. For example, in some embodiments the active layer structure can include first and second well layers with the thickness of the first well layer greater than the thickness of the second well layer where the first well layer is closer to the p-side of the device. Any combination of the embodiments described herein or portions of the described embodiments can be combined to form an active layer structure in accordance with the principles of the present invention. In some embodiments the thickness of a well layer closer to the p-side than can be thicker than a well layer closer to the n-side, and vice-versa.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A Group III nitride based light emitting diode, comprising:
   a p-type Group III nitride based semiconductor layer;
   an n-type Group III nitride based semiconductor layer; and
   a Group III nitride based active region between the p-type Group III nitride based semiconductor layer and the n-type Group III nitride based semiconductor layer, the active region comprising a plurality of sequentially stacked Group III nitride based well layers;
   wherein the plurality of well layers comprises a first well layer having a first thickness and a second well layer having a second thickness, the second well layer is between the p-type Group III nitride based semiconductor layer and the first well layer, and the second thickness is greater than the first thickness;
   wherein, in response to being energized, the light emitting diode emits light having a full width half maximum (FWHM) that is less than about 30 nm.

2. The light emitting diode of claim 1, wherein the light emitted by the light emitting diode has a FWHM that is less than about 20 nm.

3. The light emitting diode of claim 1, wherein the first well layer has a first bandgap, the second well layer has a second bandgap, and the first bandgap is less than the second bandgap.

4. The light emitting diode of claim 1, wherein the first well layer comprises $In_{X1}Ga_{1-X1}N$, the second well layer comprises $In_{X2}Ga_{1-X2}N$, and X1>X2.

5. The light emitting diode of claim 1, wherein the plurality of well layers have respective thicknesses that decrease with distance from the p-type Group III nitride based semiconductor layer.

6. The light emitting diode of claim 5, wherein the plurality of well layers have respective bandgaps that decrease with distance from the p-type Group III nitride based semiconductor layer.

7. The light emitting diode of claim 5, wherein the plurality of well layers comprise $In_XGa_{1-X}N$, where X varies in inverse proportion to the thickness of the respective well layers.

8. The light emitting diode of claim 5, wherein the plurality of well layers have respective band gaps that vary in proportion to the thickness of the respective well layers.

9. The light emitting diode of claim 5, wherein the plurality of well layers comprise $In_XGa_{1-X}N$ where 0<X<1, and wherein the plurality of well layers have indium compositions that increase with distance from the p-type Group III nitride based semiconductor layer.

10. The light emitting diode of claim 5, wherein the plurality of well layers have thicknesses that decrease approximately linearly from well layer to well layer.

11. The light emitting diode of claim 1, wherein the plurality of well layers comprises a first plurality of well layers having the first thickness and a second plurality of well layers having the second thickness.

12. The light emitting diode of claim 1, wherein the plurality of well layers comprises a first plurality of well layers having the first thickness and a second plurality of well layers having thicknesses that increase from the first thickness to the second thickness.

13. The light emitting diode of claim 12, wherein the second plurality of well layers have thicknesses that increase approximately linearly from the first thickness to the second thickness.

14. The light emitting diode of claim 11, wherein the second plurality of well layers is between the first plurality of well layers and the P-N junction.

15. The light emitting diode of claim 1, wherein the plurality of well layers comprises a first plurality of well layers having thicknesses that increase from the first thickness to the second thickness and a second plurality of well layers having the second thickness.

16. The light emitting diode of claim 15, wherein the first plurality of well layers have thicknesses that increase approximately linearly from the first thickness to the second thickness.

17. The light emitting diode of claim 15, wherein the second plurality of well layers is between the first plurality of well layers and the p-type Group III nitride based semiconductor layer.

18. The light emitting diode of claim 1, wherein the second thickness is at least about 18% greater than the first thickness.

19. The light emitting diode of claim 1, wherein the second thickness is about 25% greater than the first thickness.

20. The light emitting diode of claim 1, wherein the well layers comprise indium, and wherein a composition of indium in the first well layer is greater than a composition of indium in the second well layer.

21. The light emitting diode of claim 20, wherein the composition of indium in the well layers ranges from about 0.05 to about 0.5.

22. The light emitting diode of claim 1, further comprising a plurality of barrier layers on respective ones of the well layers including a first barrier layer on the first well layer between the first well layer and the p-type Group III nitride based semiconductor layer and a second barrier layer on the second well layer between the second well layer and the p-type Group III nitride based semiconductor layer, wherein the first barrier layer is thicker than the second barrier layer.

23. The light emitting diode of claim 1, further comprising a plurality of barrier layers on respective ones of the plurality of well layers, the plurality of barrier layers having thicknesses that increase with distance from the p-type Group III nitride based semiconductor layer.

24. The light emitting diode of claim 1, further comprising a plurality of barrier layers on respective ones of the well layers including a first barrier layer on the first well layer between the first well layer and the p-type Group III nitride based semiconductor layer and a second barrier layer on the second well layer between the second well layer and the p-type Group III nitride based semiconductor layer, wherein the second barrier layer is thicker than the first barrier layer.

25. The light emitting diode of claim 1, further comprising a plurality of barrier layers on respective ones of the plurality of well layers, the plurality of barrier layers having thicknesses that decrease with distance from the p-type Group III nitride based semiconductor layer.

26. The light emitting diode of claim 1, wherein the active region comprises a plurality of well groups, each of the well groups comprises:
   a Group III nitride based well support layer, wherein the Group III nitride based well layer is on the well support layer; and
   a Group III nitride based well cap layer on the Group III nitride based well layer.

27. The light emitting diode of claim 26, wherein a combined thickness of the well support layer and the well cap layer is from about 50 Å to about 400 Å.

28. The light emitting diode of claim 1, wherein the well layers have thicknesses of from about 10 Å to about 50 Å.

29. A Group III nitride based light emitting diode, comprising:
   an n-type Group III nitride based semiconductor layer;
   a p-type Group III nitride based semiconductor layer forming a P-N junction with the n-type Group III nitride based semiconductor layer; and
   a Group III nitride based active region comprising a plurality of sequentially stacked Group III nitride based wells including respective well layers adjacent the P-N junction;
   wherein the plurality of well layers comprises a first well layer having a first thickness and a second well layer having a second thickness, the second well layer is between the P-N junction and the first well layer, and the second thickness is greater than the first thickness;
   wherein, in response to being energized, the light emitting diode emits light having a full width half maximum (FWHM) that is less than about 30 nm.

30. A Group III nitride based light emitting diode, comprising:
   a p-type Group III nitride based semiconductor layer;
   an n-type Group III nitride based semiconductor layer that forms a P-N junction with the p-type Group III nitride based semiconductor layer; and a Group III nitride based active region on the n-type Group III nitride based semiconductor layer, the active region comprising a plurality of sequentially stacked Group III nitride based wells including respective well layers;

wherein the plurality of well layers comprises a first well layer having a first thickness and a second well layer having a second thickness that is greater than the first thickness; and wherein, in response to being energized, the light emitting diode emits light having a full width half maximum (FWHM) that is less than about 30 nm.

31. A Group III nitride based light emitting diode, comprising:

a first light emitting well layer having a first thickness and configured to generate light having a first dominant wavelength when energized by passing electric current therethrough; and a second light emitting well layer having a second thickness that is different from the first thickness and that is configured to generate light having a second dominant wavelength when energized by passing electric current therethrough;

wherein the first dominant wavelength is no more than about 10 nm different from the second dominant wavelength.

32. The Group III nitride based light emitting diode of claim 31, wherein the first dominant wavelength is no more than about 5 nm different from the second dominant wavelength.

33. The Group III nitride based light emitting diode of claim 31, wherein the first dominant wavelength is no more than about 2.5 nm different from the second dominant wavelength.

* * * * *

UNITED STATES PATENT AND TRADEMARK OFFICE
CERTIFICATE OF CORRECTION

PATENT NO. : 8,575,592 B2  
APPLICATION NO. : 12/699541  
DATED : November 5, 2013  
INVENTOR(S) : Bergmann et al.

Page 1 of 1

It is certified that error appears in the above-identified patent and that said Letters Patent is hereby corrected as shown below:

In the Specification:

Column 5, Line 14: Please correct "6G, 6E, 6I," to read -- 6G, 6H, 6I, --

Signed and Sealed this  
Tenth Day of March, 2015

Michelle K. Lee  
*Deputy Director of the United States Patent and Trademark Office*